United States Patent [19]

Kurihara

[11] Patent Number: 5,500,868
[45] Date of Patent: Mar. 19, 1996

[54] VERTICAL-TO-SURFACE TRANSMISSION ELECTRO-PHOTONIC DEVICE WITH ION IMPLANTED CURRENT CONTROL REGIONS

[75] Inventor: Kaori Kurihara, Tokyo, Japan

[73] Assignee: NEC Corporation, Tokyo, Japan

[21] Appl. No.: 190,242

[22] Filed: Feb. 1, 1994

[30] Foreign Application Priority Data

Feb. 1, 1993 [JP] Japan ................................. 5-014548

[51] Int. Cl.$^6$ ...................................................... H01S 3/18
[52] U.S. Cl. ........................................ 372/46; 372/96
[58] Field of Search ............................... 372/43–46, 50, 372/96

[56] References Cited

U.S. PATENT DOCUMENTS 5,274,655  12/1993  Shieh et al. ............................... 372/96

FOREIGN PATENT DOCUMENTS 0452032  10/1991  European Pat. Off. .
56-35487   4/1981  Japan .
61-40077   2/1986  Japan .

OTHER PUBLICATIONS

By K. Kurihara et al., "High Electronic–Optical Conversion Efficiency in a Vertical Surface Transmission Electro–Photonic Device with a Vertical Cavity", The Japanese Society of Applied Physics, 1992, pp. 598–600. (No month available).

By H. Yoo et al., "Fabrication of Vertical–Cavity Front–Surface–Emitting Laser Diode (FSELD) Using a Heterojunction Bipolar Transistor Process", Japanese Journal of Applied Physics, Mar. 1991, vol. 30, No. 3B, pp. 492–494.

By K. Kurihara et al., "Double–Mesa–Structure Vertical-to-–Surface Transmission Electro–Photonic Device with a Vertical Cavity", Japanese Journal of Applied Physics, 1993, vol. 32, No. 1B, pp. 604–608. (Jan.).

Primary Examiner—Rodney B. Bovernick
Assistant Examiner—Robert McNutt
Attorney, Agent, or Firm—Young & Thompson

[57] ABSTRACT

The invention provides a vertical-to-surface transmission electro-photonic semiconductor device with a mesa structure of light reflective multiple layers in which the device includes a high resistive region for a carrier confinement. The high resistive region is formed by an ion-implantation of proton in a downward oblique direction during a rotation of a semiconductor substrate with use of a photo-resist mask whose horizontal width is larger than that of the mesa structure. The high resistive region defines a light emitting area of an active layer, an inverse circular truncated cone like definition of a top cladding region and a circular truncated cone like definition of a bottom cladding region. The oblique angle ion-implantation permits the top cladding region to be free from any exposure of the ion-implantation thereby an electrical resistance of the device is reduced.

10 Claims, 33 Drawing Sheets

LASER BEAM

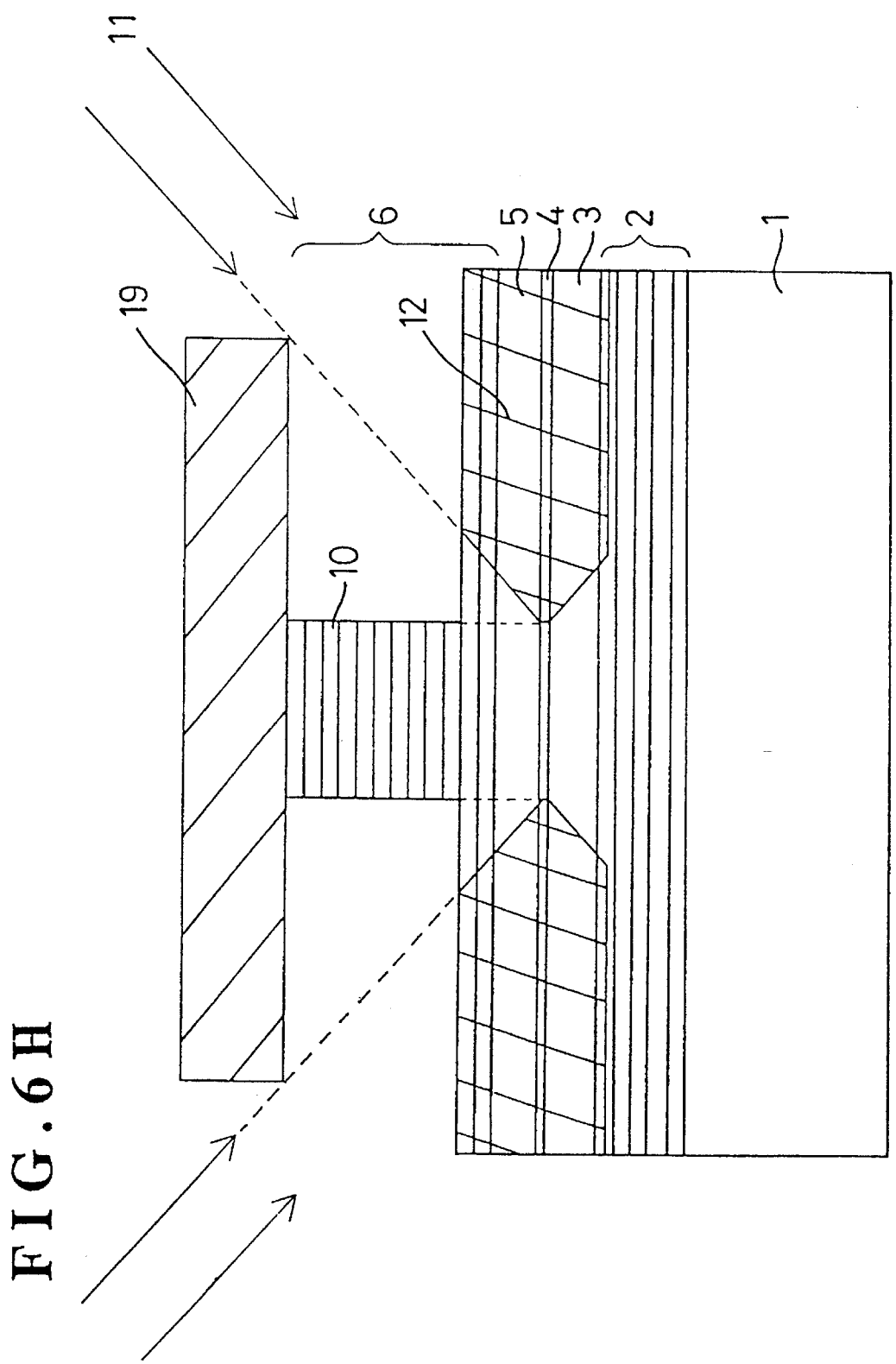

VERTICAL-TO-SURFACE TRANSMISSION ELECTRO-PHOTONIC DEVICE WITH ION IMPLANTED CURRENT CONTROL REGIONS

BACKGROUND OF THE INVENTION

The invention relates to a semiconductor electro-photonic device, and more particularly to a vertical-to-surface transmission electro-photonic device.

The stage of revolutions in the semiconductor material technology is entering into the age of developments in electro-photonic semiconductor devices including electronic and photonic devices for optical data transmission and information processing. The value and importance in realizations of high density and high speed parallel optical transmission, processing and computing application will be on the increase in the semiconductor industry. The optical transmission devices such as light emitting devices for such the optical transmission and processing may be divided into two types. One is an edge transmission device and the other is the vertical to surface transmission device. The vertical-to-surface transmission electro-photonic device will receive a great deal of attention increasingly as being suitable for a two-dimensional integration which is able to permit the high density and high speed parallel optical transmission, processing and computing application. Such the vertical-to-surface transmission electro-photonic device as integrated in two-dimensional arrays is required to possess excellent properties such as a high efficiency in the electronic-optical power conversion and a low electrical resistance for the above high density and high speed parallel optical transmission, processing and computing application. For the properties of the vertical-to-surface transmission electro-photonic device, failure of either the high efficiency in the electronic-optical power conversion or the low electrical resistance makes it difficult to accomplish the high density and high speed parallel optical transmission, processing and computing application. For that reason, it seems essential that the vertical-to-surface transmission electro-photonic device is required to possess the above both properties or the high efficiency in the electronic-optical power conversion and the low electrical resistance. So far as the inventor's knowledge, any of the conventional vertical-to-surface transmission electro-photonic devices have, however, possessed insufficient properties both in the electronic-optical power conversion efficiency and in the device resistance.

A typical structure of the conventional vertical-to-surface transmission electro-photonic device with a vertical cavity includes top and bottom reflective mirrors which sandwich intermediate layers. The intermediate layers constitutes a double hetero structure which comprises an active layer with a smaller refractive index and cladding layers with a larger refractive index sandwiching the active layer. Such the double hetero structure with a compositional variation provides a potential well to confine injection carriers and a refractive index discontinuity. The carrier confinement greatly enhances the utilization of injection carriers. The optical confinement causes the stimulated emission. The light or laser emission requires an injection of carriers or electrons and holes into the active layer. The injection of the carriers into the active layer is able to cause the population inversion of of electrons in the active layer. The population inversion of electrons causes the recombination of electrons and holes which causes the spontaneous emission of photons or light. The light caused by the spontaneous emission is confined in the active layer with the smaller refractive index sandwiched by the cladding layers with the larger reflactive index. The confinement of the light caused by the spontaneous emission causes the stimulated downward transition of electrons which is able to emits photons or light. In the surface emitting layer, the propagation of the light emitted by the stimulated emission appears in a vertical direction to a surface of the active layer. As described the above, since the light emitted from the active layer in the vertical direction is generated in the active layer by the spontaneous emission and the stimulated emission, an amount of the power of the light emitted from the active layer is defined by not only a magnitude of the carrier injection into the active layer but also a size of the active region in the vertical direction, namely a thickness of the active layer. Needless to say, a large thickness of the active layer is able to permit of a generation of a large power light emission in the direction vertical to surface of the active layer. Generally, however, the active layer is required to be extremely thin as comprising a potential well structure such as a single or multiple quantum well structure.

A further enhancement of the stimulated downward transition of electrons or the stimulated emission requires a further optical confinement for much more enhancement of the utilization of the light emitted from the active layer. The further optical confinement of the light emitted in the direction vertical to the surface of the active layer is made in the vertical cavity. The vertical cavity comprises a pair of reflective mirrors such as distributed Bragg reflective mirrors for reflecting the emitted light in the direction vertical to the surface of the active layer. The reflective mirrors are provided to sandwich the intermediate layers having the potential well structure formed by the active layer sandwiched by the cladding layers. The reflective mirrors are required to have a large reflectivity. The large reflectivity is provided by a large refractive index discontinuity due to the compositional variation which appears on an interface between a small refractive index semiconductor layer and a large refractive index semiconductor layer. For example, to obtain a large reflectivity, each of the reflective mirrors may comprise alternate laminations of large refractive index semiconductor layers such as AlAs layers and small refractive index semiconductor layers such as GaAs layers.

The large discontinuity of the reflactive index due to the compositional variation simultaneously provides a large energy band gap discontinuity. Then, the interface between the small refractive index semiconductor layer and the large refractive index semiconductor layer necessarily has a large energy band gap discontinuity in the direction across the interface. The large energy band gap discontinuity necessarily provides a large potential barrier to carriers or electrons and holes across the interface between the small and large refractive index semiconductor layers, for example, the interface between the GaAs/AlAs layers. In the conventional surface emitting layer device with the vertical cavity, the carriers are generally injected through the reflective mirror and the cladding layer into the active layer. In the conventional surface emitting laser device, a current pass of the injection carrier exists across the interface between the small and large refractive index semiconductor layers such as the GaAs/AlAs layers in the reflective mirrors. Then, the current pass of the injection carriers exists across the potential barriers which appear on the interface between the small and large refractive index semiconductor layers.

From the above descriptions, the reflective mirror with a large reflectivity suitable for optical confinement has a large potential barrier due to the large energy band gap discontinuity. In such the reflective mirror, the injection carrier necessarily experiences a large potential barrier. This provides the enhancement of an electrical resistance of the current pass in the laser device. The enhancement of the electrical resistance causes problems with a requirement of a large electrical power of the current injection for obtaining the necessary light emission as well as a generation of a large heat due to the current of the injection carrier through the potential barrier. Either the requirement of the large electrical power of the injection current or the generation of the large heat constitutes a bar to realize the high density integration in the two dimensional arrays and the high speed performance of the laser device with a lower power consumption.

To settle the above problems, the vertical-to-surface transmission layer device is required to possess a high efficiency in the electronic-optical power conversion and a low electrical resistance for the above high density and high speed parallel optical transmission, processing and computing application. The realization of the high efficiency in the electronic-optical power conversion requires the high reflectivity of the reflective mirrors which forms the vertical cavity to confine the stimulated emission light for a further enhancement of the stimulated downward transition of electrons or the stimulated emission. On the other hand, the realization of the low electrical resistance requires a bypass of the currents of the injection carriers to avoid the interfaces of the small and large refractive index semiconductor layers having a large difference in the energy band gap so that the injection carriers are permitted to be free from any large potential barrier. The majority carriers of the p-type semiconductor are holes whose effective mass is larger than the effective mass of electrons serving as the carriers in the n-type semiconductor.

Particularly, the potential barrier to holes having the large effective mass rather than that of electrons is a serious problem as providing a large enhancement of the electrical resistance to the injection carriers. Namely, the potential barrier in the reflective mirror made of p-doped semiconductor layers provides such serious problem.

To settle the above issue, surface emitting laser devices with any mesa structure were proposed in which a majority of the carriers injected from the p-electrode flows on a bypass avoiding the potential barrier against holes caused by the energy band gap discontinuity in the reflective mirror made of the p-doped semiconductors as illustrated in FIGS. 4A and 4B. Such the mesa structure surface emitting laser devices were reported by Kurihara et al. in 1993 Japan J. Applied Physics Vol. 32. pp. 604–608 as well as in Extended Abstracts of the 1992 International Conference on Solid State Device and Materials, pp. 598–600.

That conventional device or a vertical-to-surface transmission electro-photonic device with a mesa structure will hereinafter be described in detail with reference back to FIG. 1. A substrate 1 for the vertical-to-surface transmission electro-photonic device with a vertical cavity is made of n-GaAs semiconductor compound. A bottom distributed Bragg reflector mirror 2 comprises n-GaAs layers and n-AlAs layers which are alternately laminated in which the lamination comprises nine periods of the n-GaAs layer and n-AlAs layers, each of which has a thickness corresponding to a quater of a medium wavelength. The bottom distributed Bragg reflector mirror 2 is formed on a top surface of the n-GaAs substrate 1, although only a top pair of the n-GaAs layer and the n-AlAs layer is partially formed except in an n-electrode area. The n-GaAs layers and n-AlAs layers have a relatively large difference in those refractive index to serve as the distributed Bragg reflective mirror. The n-GaAs layers and n-AlAs layers with the large difference in the refractive index have also a relatively large difference in the energy band gap. A bottom cladding layer 3 made of n-$Al_{0.3}Ga_{0.7}As$ is formed on the bottom distributed Bragg reflector mirror 2. An active layer 4 is formed on a top surface of the bottom cladding layer 3 in which the active layer comprises an i-$In_{0.2}Ga_{0.8}As$ layer which forms a single quantum well structure. A top cladding layer 5 made of p-$Al_{0.3}Ga_{0.7}As$ is formed on a top surface of the active layer 4. A top distributed Bragg reflector mirror 6 comprises p-GaAs layers and p-AlAs layers which are alternately laminated in which the lamination comprises eleven periods of the p-GaAs layers and p-AlAs layers, each of which has the thickness corresponding to a quater of the medium wavelength. The top distributed Bragg reflector mirror 6 is formed on a predetermined area in a top surface of the top cladding layer 5 in which the predetermined area corresponds to a light emitting area in the device, notwithstanding only a bottom pair of the p-GaAs layer and the p-AlAs layer is formed on an entire top surface of the top cladding layer 5. This results in that the top distributed Bragg reflector mirror 6 has a mesa structure. The p-GaAs layers and p-AlAs layers have a relatively large difference in those refractive indexes to serve as the distributed Bragg reflective mirror. The p-GaAs layers and p-AlAs layers with the large difference in the refractive index have also a relatively large difference in the energy band gap.

As described above, the conventional vertical-to-surface transmission electro-photonic device has a vertical cavity which comprises the top and bottom distributed Bragg reflector mirrors 6 and 2 in which the reflective mirrors 6 and 2 sandwich intermediate layers comprising the active layer 4 and the top and bottom cladding layers 5 and 3. Moreover, the conventional vertical-to-surface transmission electro-photonic device has not only the above mesa structure of the top distributed Bragg reflector mirror 6 but also high resistive regions 12 comprising proton-implanted regions. As illustrated in FIG. 1, the high resistive regions 12 are partially formed except in the light emitting area in the intermediate layers, namely the active layer 5 and the top and bottom cladding layers 5 and 3. It is desired that the high resistive regions 12 are tapering off as illustrated in FIG. 1, although it is difficult to form so. A horizontal distance between the high resistive regions 12 is equal to a length of the light emitting area under the mesa structure of the top distributed Bragg reflector 6.

A p-electrode 14 is formed to cover the mesa structure of the top distributed Bragg reflector mirror 6 and its adjacent portions. An n-electrode 13 is formed on the n-electrode region without the intermediate layers in which the bottom distributed Bragg reflector mirror 2 is exposed.

The description will subsequently be directed to fabrication processes for the above conventional vertical-to-surface transmission electro-photonic device.

With reference to FIG. 2A, the n-GaAs substrate 1 is prepared and the n-GaAs layers and the n-AlAs layers are epitaxially and alternately grown by molecular beam epitaxy on the top surface of the n-GaAs substrate 1 until the nine periods of the alternations of the n-GaAs layers and the n-AlAs layers are formed to serve as the bottom distributed Bragg reflector mirror 2. The n-$Al_{0.3}Ga_{0.7}As$ epitaxial layer serving as the cladding layer 3 is grown by molecular beam epitaxy on the top surface of the bottom distributed Bragg reflector mirror 2. The non-doped $In_{0.2}Ga_{0.8}As$ epitaxial layer serving as the active layer 4 is grown on the top surface of the bottom cladding layer 3 by molecular beam epitaxy.

The p-Al$_{0.3}$Ga$_{0.7}$As epitaxial layer serving as the top cladding layer 5 is grown on the active layer 4 by molecular beam epitaxy. The p-GaAs layers and the p-AlAs layers are epitaxially and alternately grown by molecular beam epitaxy on the top surface of the top p-doped cladding layer 5 until the eleven periods of the alternations of the p-GaAs layers and the p-AlAs layers are formed to serve as the p-doped top distributed Bragg reflector mirror 6 thereby a vertical-to-surface emitting laser substrate 7 is completed.

With reference to FIG. 2B, a photo-resist film is formed on a top surface of the p-doped top distributed Bragg reflector 6 in the vertical-to-surface emitting laser substrate 7. A patterning for the photo-resist film is accomplished so that the photo-resist film is partially removed and a photo-resist pattern remains only in the light emitting area in which the mesa structure of the p-doped top distributed Bragg reflector will be formed.

With reference to FIG. 2C, except for the bottom one or two periods of the p-GaAs layer and the p-AlAs layer, the p-doped top distributed Bragg reflector mirror 6 is selectively removed by a reactive ion-etching 9 using a chlorine gas and the photo-resist pattern 8 so that the mesa structure 10 of the p-doped top distributed Bragg reflector 6 is defined in the light emitting area covered by the photo-resist mask 8.

With reference to FIG. 2D, an ion-implantation of proton in a vertical direction is accomplished by use of the photo-resist mask 8 so that proton is implanted into the epitaxial intermediate layers except in the light emitting area covered by the photo-resist mask 8. This results in that the epitaxial intermediate layers except in the light emitting area covered by the photo-resist mask 8 become high resistive regions 12 of the proton implanted regions. So far as the proton or other impurity implantations in the vertical direction are concerned, the light emitting area is defined by the photo-resist mask 8 used for the proton implantation. In the above processes, the photo-resist mask 8 was used not only in the dry etching process to form the mesa structure 10 of the p-doped top distributed Bragg reflector mirror 6 but also in the proton implantation process to form the high resistive regions 12. For those reasons, the size of the photo-resist mask 8 is able to define not only a horizontal size of the mesa structure 10 of the p-doped top distributed Bragg reflector mirror 6 but also a size of the light emitting area surround by the proton implanted regions as the high resistive regions 12.

With reference to FIGS. 2E and 2F, the photo-resist mask 8 is removed, after that a photo-resist film is formed on an entire surface of the device to cover the mesa structure 10 of the p-doped top distributed Bragg reflector mirror 6 and peripheral flat surface of the device. The photo-resist film is patterned so that part of the photo-resist film only in the n-electrode region is removed to serve as a photo-resist mask. A selective wet etching is accomplished by use of the photo-resist mask so that the bottom pair of the p-GaAs/AlAs layers involved in the p-doped top distributed Bragg reflector mirror 6 is partially etched but only in the n-electrode region. Subsequently, the p-doped top cladding layer 5, the active layer 4 and the bottom cladding layer 3 are partially etched in turn in the n-electrode region. Further, a top pair of the n-GaAs/AlAs layers involved in the n-doped bottom distributed Bragg reflector 2 is partially etched in the n-electrode region. The above wet etching is accomplished until at least the n-doped bottom distributed Bragg reflector mirror 2 is exposed.

With reference to FIG. 2G, an n-electrode is formed on the exposed surface in the n-electrode region of the n-doped bottom distributed Bragg reflector mirror 2. A p-electrode is formed to cover both the mesa structure 10 of the p-doped top distributed Bragg reflector mirror as well as flat portions adjacent to the mesa structure 10 of the p-GaAl/AlAs layers involved in the p-doped top distributed Bragg reflector mirror 6 thereby the fabrication processes for the conventional vertical-to-surface transmission electro-photonic device is completed.

As to the ion-implantation of proton in the vertical direction to form the proton implanted regions as the high resistive region, ideally, the proton is implanted at a predetermined energy such that a proton concentration profile in the vertical direction has a peak value in the active layer 4 thereby a cross sectional definition of the proton implanted region is tapering off toward the light emitting area. So far as the proton implantation or other impurity implantation in the vertical direction is concerned, it is, however, difficult to obtain the above tapering cross sectional definition of the proton implanted region. Actually, somewhat of the implanted protons is subject to remaining at portions adjacent to the surface exposed to the proton implantation around the mesa structure 10 of the p-doped top distributed Bragg reflector mirror 6. For that reason, in the area adjacent to the mesa structure 10, the bottom pair in the p-doped top distributed Bragg reflector mirror 6 and the p-doped top cladding layer 5 become resistive regions.

In the p-side of the device, it is important to suppress the carrier to show a downward current through the mesa structure 10 including the alternating laminations of the GaAs/AlAs layers which forms relatively large potential barriers due to relatively large energy band gap discontinuities. The large energy band gap discontinuity is caused by the compositional discontinuity of the GaA/AlAs layers. The compositional discontinuity is necessary to permit the large reflectivity possessed by the p-type top distributed Bragg reflector of the mesa structure 10.

As described above, it could be understood that the mesa structure 10 of the p-type top distributed Bragg reflector has a large electrical resistance to the majority carriers or holes. For that reason, a large part of the carriers or holes is supplied from a peripheral portion of the p-electrode 14 around the mesa structure 10 and subsequently flow through the top pair of the p-GaAs/AlAs semiconductor layers and the p-type top cladding layer 5 and then injected into the active layer 4. At this time, the transmitted carriers are subjected to the horizontal carrier confinement into the light emitting area by the high resistive regions 12 of the proton implanted regions with the tapering structure.

The conventional device is, however, engaged with the following problems. As described above, a large part of the injection carriers flows from the peripheral portion of the mesa structure 10 toward the light emitting area in the active layer 4 and receives the carrier confinement by the high resistive regions 12 of the proton implanted regions. Namely, a large part of the injection carriers flows part of the bottom pair of the p-GaAs/AlAs and the p-cladding layer 5 over the tapering portions of the high resistive regions 12 around the mesa structure 10. However, as described above, the actual proton implantation in the vertical direction necessarily permits somewhat of the protons not to reach the active layer 4 and thus to remain in the part of the p-GaAs/AlAs layers and the p-cladding layer 5 over the tapering portions of the high resistive regions 12 around the mesa structure 10.

From the above, it could readily be appreciated that the part of the p-GaAs/AlAs layers and the p-cladding layer 5 over the tapering portions of the high resistive regions 12 is a somewhat high resistive region not so much as the high resistive regions 12. The majority of the carriers or holes flows through the somewhat resistive part the p-GaAs/AlAs layers and the p-cladding layer 5 over the tapering portions of the high resistive regions 12. This provides the effective and actual increase of the electrical resistance of the device. This makes it impossible to provide a low electrical resistance which is one of the most important factors for the vertical-to-surface light emitting device.

To settle the above serious problem, an alternative proposal for the vertical-to-surface light emitting device have been known in the art, to which the present invention pertains. FIG. 3 illustrates a cross sectional structure of the another conventional vertical-to-surface light emitting device with the vertical cavity. It could readily be appreciated that the another conventional vertical-to-surface light emitting device as illustrated in FIG. 3 has a remarkable difference in the structure from the conventional vertical-to-surface light emitting device as illustrated in FIG. 1. The remarkable difference appears in a horizontal size of the active layer 4 defined by the tapering portions of the high resistive regions 12 of the proton implanted regions or in a horizontal distance between the high resistive regions 12 of the proton implanted regions. While the conventional vertical-to-surface light emitting laser as illustrated in FIG. 1 has the same horizontal distance between the high resistive regions 12 as the width of the mesa structure, the another conventional vertical-to-surface light emitting laser as illustrated in FIG. 3 has a larger horizontal distance D2 between the high resistive regions 12 than the width D1 of the mesa structure 10. Such a larger horizontal distance D2 between the high resistive regions 12 than the width D1 of the mesa structure 10 is able to permit the device to be free from the above problem as to the high electrical resistance. In the alternative conventional vertical-to-surface light emitting device, the majority of the carriers or holes supplied from the flat and peripheral part of the p-electrode 14 around the mesa structure 10 is able to flow through proton free p-type epitaxial layers into the active layer. Almost no carriers or holes flows through the somewhat resistive part of the p-type epitaxial layers over the tapering portions of the proton implanted high resistive regions 12 into the active layer 4.

Such the vertical-to-surface light emitting device with the larger carrier injection area of the active layer 4 illustrated in FIG. 3 is, however, engaged with the following disadvantage. The injection carriers receive almost no carrier lateral confinement by the proton implanted high resistive regions 12. This results in a low current density of the injection carriers or holes into the active layer 4 in the enlarged carrier injection area with the wide width of D2. The low current density of the injection carriers into the enlarged carrier injection area of the active layer 4 results in a reduction of the power of the light or laser emitted from the active layer. A strong light or laser emission requires a further large injection carrier which leads to a reduction in the electric-optical conversion efficiency. Such vertical-to-surface light emitting device including the enlarged carrier injection area of the active layer is unavoidably engaged with the disadvantage in the low efficiency in the electronic-optical conversion.

It has therefore been required to develop a novel vertical-to-surface transmission electro-photonic device which possesses not only a high efficiency in the electronic-optical conversion but also an extremely low electrical resistance.

SUMMARY OF THE INVENTION

Accordingly, it is a primary object of the present invention to provide a novel vertical-to-surface transmission electro-photonic device free from any problems as mentioned in the above.

It is an object of the present invention to provide a novel vertical-to-surface transmission electro-photonic device which possesses a reduced electrical resistance.

It is a further object of the present invention to provide a novel vertical-to-surface transmission electro-photonic device which possesses a property of a high electronic-optical conversion efficiency.

It is a further more object of the present invention to provide a novel vertical-to-surface transmission electro-photonic device which possesses a property of a low power consumption.

It is a still further object of the present invention to provide a novel vertical-to-surface transmission electro-photonic device which is suitable for high density two-dimensional arrays for parallel optical processing and transmissions.

It is yet a further more object of the present invention to provide a novel vertical-to-surface transmission electro-photonic device which shows high speed optical processing and transmissions.

It is an additional object of the present invention to provide a novel method for fabricating a vertical-to-surface transmission electro-photonic device free from any problems as mentioned in the above.

It is another object of the present invention to provide a novel method for fabricating a vertical-to-surface transmission electro-photonic device which possesses a reduced electrical resistance.

It is still another object of the present invention to provide a novel method for fabricating a vertical-to-surface transmission electro-photonic device which possesses a property of a high electronic-optical conversion efficiency.

It is yet another object of the present invention to provide a novel method for fabricating a vertical-to-surface transmission electro-photonic device which possesses a property of a low power consumption.

It is a still additional further object of the present invention to provide a novel method for fabricating a vertical-to-surface transmission electro-photonic device which is suitable for high density two-dimensional arrays for parallel optical processing and transmissions.

It is yet a further more object of the present invention to provide a novel method for fabricating a vertical-to-surface transmission electro-photonic device which shows high speed optical processing and transmissions.

The above and objects, features and advantages of the present invention will be apparent from the following descriptions.

The present invention provides a vertical-to-surface transmission electro-photonic semiconductor device. The device includes a semiconductor substrate, a first light reflective means formed on the semiconductor substrate for reflecting a light propagated in a vertical direction, a first cladding region of a first conductivity type being selectively formed on a part of the first reflective means in which the first cladding region has a definition of a circular truncated cone, an active layer defined within a light emitting area and being formed on a top surface of the first cladding layer, a second cladding layer of a second conductivity type formed on the active layer in the light emitting area in which the second cladding region has a definition of an inverse circular truncated cone, a carrier confinement means comprising a high resistive region formed to define the light emitting area of the active layer, the circular truncated cone definition of the first cladding region and the inverse circular truncated cone definition of second cladding region, a second light reflective means having a mesa structure selectively formed on a part of a top surface of the second cladding region for reflecting a light propagated in a vertical direction and the predetermined area approximately corresponding to the light emitting area in a plane view, a first electrode provided on a part of the device under the active layer except in the high resistive region, and a second electrode formed to cover at least a peripheral of the mesa structure.

The inverse circular truncated cone definition of the second cladding region has a side surface with an oblique angle of approximately 14° at an included angle to a surface of the active layer. The high resistive region of the carrier confinement means is formed by a selective ion-implantation with use of a mask having a larger horizontal size than a horizontal size of the mesa structure at an oblique angle corresponding to an oblique angle of a side surface of the inverse circular truncated cone definition of the second cladding layer so that the entire of the second cladding region having the inverse circuit truncated cone definition is completely free from the ion-implantation.

The oblique angle and the horizontal size of the mask for the ion-implantation are respectively defined to comply with the following conditions:

$$B=(2D(W_1+W_2)/W_2)+A; \text{ and}$$

$$\beta=\tan^{-1}(W_2+D)$$

where B is the horizontal size of the mask, $\beta$ is the oblique angle being an included angle to the horizontal line, $W_1$ is a vertical distance between a bottom surface of the mask and the top surface of the second cladding region, $W_2$ is a depth of the active layer from the top surface of the second cladding region, A is a horizontal size of the active layer formed within the light emitting area defined by the high resistive region and D is a horizontal distance between an edge of the top surface of the second cladding region and an edge of the light emitting area of the active layer.

The ion-implantation is accomplished during a rotation of the semiconductor substrate around a vertical center axis of the device.

The mesa structure of the second light-reflective means either comprises a rectangular-shaped section or comprises a bottom trapezoid-shaped section and a top rectangular-shaped section.

Alternatively, the first cladding region may have a definition of a truncated pyramid and the second cladding region may have a definition of an inverse truncated pyramid. In this case, the high resistive region is formed to define the light emitting area of the active layer, the truncated pyramid definition of the first cladding region and the inverse truncated pyramid definition of second cladding region.

The present invention also provide a novel method of fabricating a vertical-to-surface transmission electro-photonic semiconductor device. The novel fabrication method comprises the steps of growing first light reflective multiple layers on a top surface of a semiconductor substrate, growing a first cladding layer of a first conductivity type on a top surface of the first light reflective multiple layers, growing an active layer on a top surface of the first cladding layer, growing a second cladding layer of a second conductivity type on a top surface of the active layer, selectively growing second light reflective multiple layers having a mesa structure in a predetermined area on a top surface of the second cladding layer, forming a photo-resist mask on a top of the mesa structure of the second light reflective multiple layers in which the photo-resist mask has a larger horizontal size than a horizontal size of the mesa structure, selectively subjecting a part of the device to an ion-implantation in a predetermined downward oblique direction with use of the photo-resist mask to form a high resistive region which defines an ion-free region having an inverse circular truncated cone definition of the second cladding layer, an ion-free light emitting area of the active layer and an ion-free region having a circular truncated cone definition of the first cladding layer in which the predetermined downward oblique direction for the ion-implantation defines a slop of a side surface of the ion-free inverse circular truncated cone definition region of the second cladding layer, removing the photo-resist mask, and providing a first electrode on a part of the semiconductor substrate and a second electrode on at least a top surface of the ion-free inverse circular truncated cone region of the second cladding layer.

The predetermined downward oblique direction for the ion-implantation is defined to have an included angle of approximately 14° to a surface of the active layer. The downward oblique direction and the horizontal size of the mask for the ion-implantation process are respectively defined to comply with the following conditions:

$$B=(2D(W_1+W_2)/W_2)+A; \text{ and}$$

$$\beta=\tan^{-1}(W_2+D)$$

where B is the horizontal size of the mask, $\beta$ is the oblique angle being an included angle to the horizontal line, $W_1$ is a vertical distance between a bottom surface of the mask and the top surface of the second cladding region, $W_2$ is a depth of the active layer from the top surface of the second cladding region, A is a horizontal size of the active layer formed within the light emitting area defined by the high resistive region and D is a horizontal distance between an edge of the top surface of the second cladding region and an edge of the light emitting area of the active layer. The ion-implantation is accomplished during a rotation of the semiconductor substrate around a vertical center axis of the device.

The photo-resist mask for the ion-implantation is formed by the following method comprising the steps of applying a photo-resist material on an entire surface of the device to cover the mesa structure of the second light reflective multiple layers, selectively removing the photo-resist material by etching to expose a top surface of the mesa structure of the second light reflective multiple layers, forming negative photo-resist film on the exposed top surface of the mesa structure and on an exposed surface of the remaining photo-resist material, and subjected the negative photo-resist film to patterning to form the photo-resist mask.

The mesa structure of the second light reflective multiple layers comprises a rectangular-shaped section being formed by the following method comprising the steps of selectively forming a mask pattern in a predetermined area on a top surface of the second light reflective multiple layers, selectively removing a part of the second light reflective multiple layers by an etching with use of the mask pattern, and removing the mask pattern.

Alternatively, the mesa structure of the second light reflective multiple layers comprises a bottom trapezoid-shaped section and a top rectangular-shaped section being formed by the following method comprising the steps of selectively forming mask pattern in a predetermined area on a top surface of the second light reflective multiple layers, selectively removing apart of the second light reflective multiple layers by an etching with use of the mask pattern, and subjecting the remaining part of the second reflective multiple layers to a wet etching. The photo-resist mask for the ion-implantation is carried out with use of the mask pattern used in the mesa structure formation processes.

Alternatively, a part of the device may be subjected to an ion-implantation in a predetermined downward oblique direction with use of the photo-resist mask to form a high resistive region which defines an ion-free region having an inverse truncated pyramid definition of the second cladding layer, an ion-free light emitting area of the active layer and an ion-free region having a truncated pyramid definition of the first cladding layer in which the predetermined downward oblique direction for the ion-implantation defines a slop of a side surface of the ion-free inverse truncated pyramid definition region of the second cladding layer. In this case, the ion-implantation is accomplished during a stationary state of the semiconductor substrate and is discontinued during a rotation of the semiconductor substrate around a vertical center axis of the device by a predetermined angle.

BRIEF DESCRIPTION OF THE DRAWINGS

Preferred embodiments of the present invention will hereinafter fully be described in detail with reference to the accompanying drawings.

FIGS. 6A to 6J are fragmentary cross sectional elevation views illustrative of sequential steps involved in a novel method for fabricating a novel vertical-to-surface transmission electro-photonic device of a first embodiment according to the present invention.

PREFERRED EMBODIMENTS OF THE INVENTION

Figure 1:
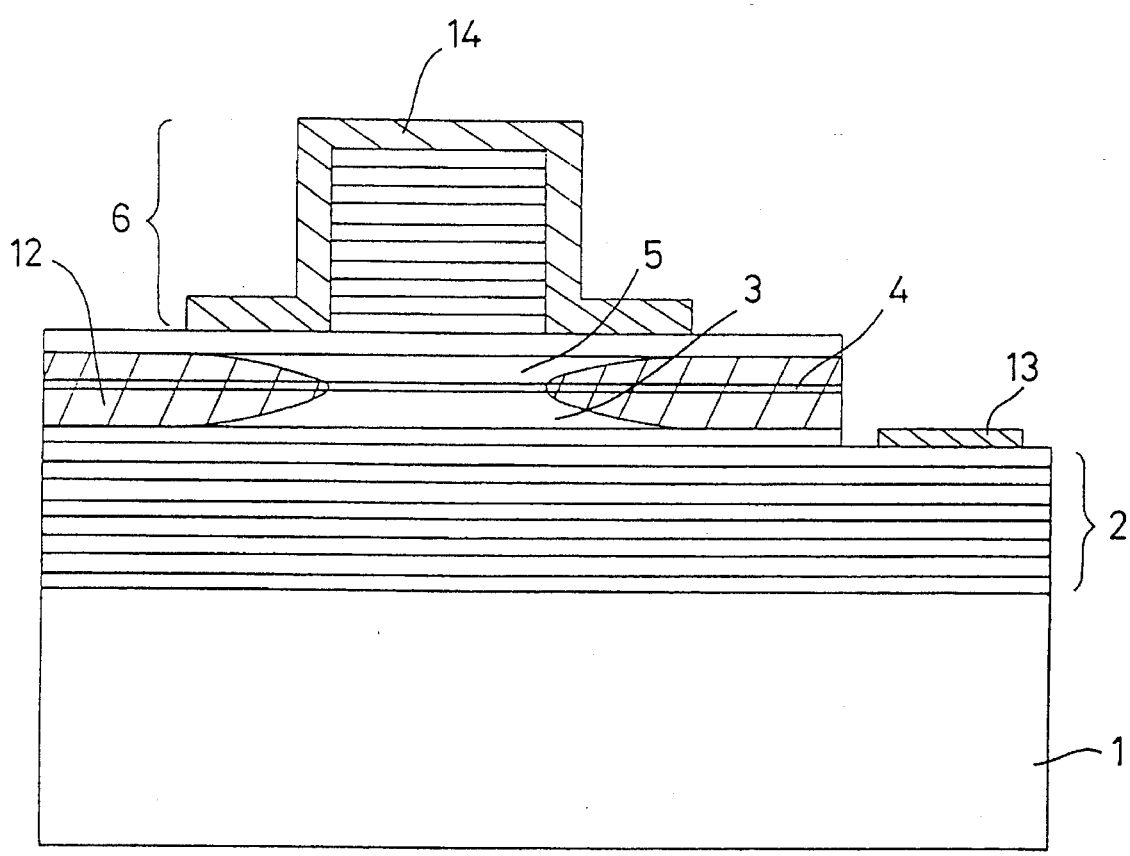
FIG. 1 is a fragmentary cross sectional elevation view illustrative of the structure of the conventional vertical-to-surface transmission electro-photonic device.
Figure 2A:
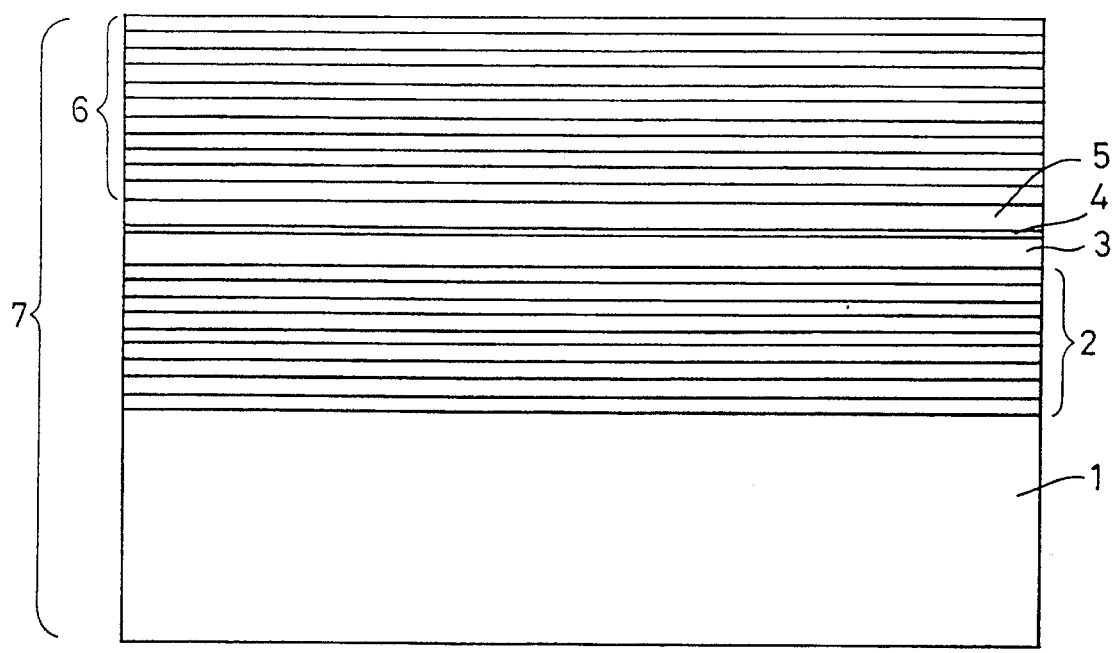
FIGS. 2A to 2G are fragmentary cross sectional elevation views illustrative of sequential steps involved in the conventional method for fabricating the conventional vertical-to-surface transmission electro-photonic device.
Figure 2B:
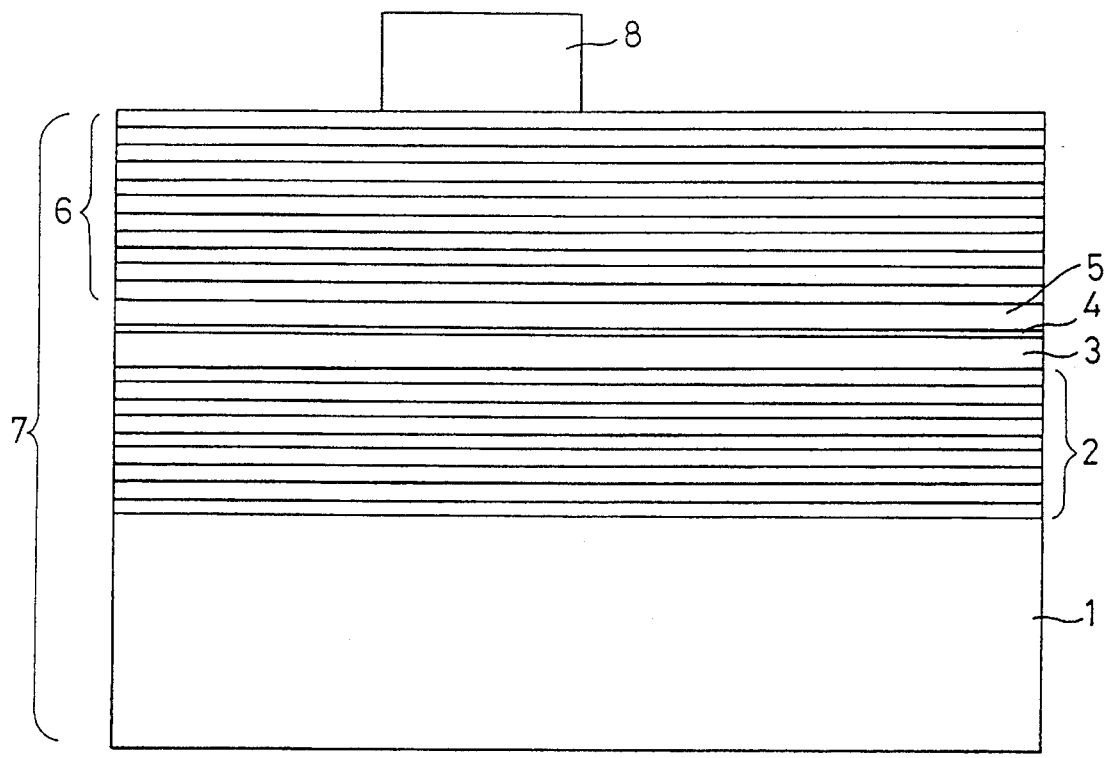
Figure 2C:
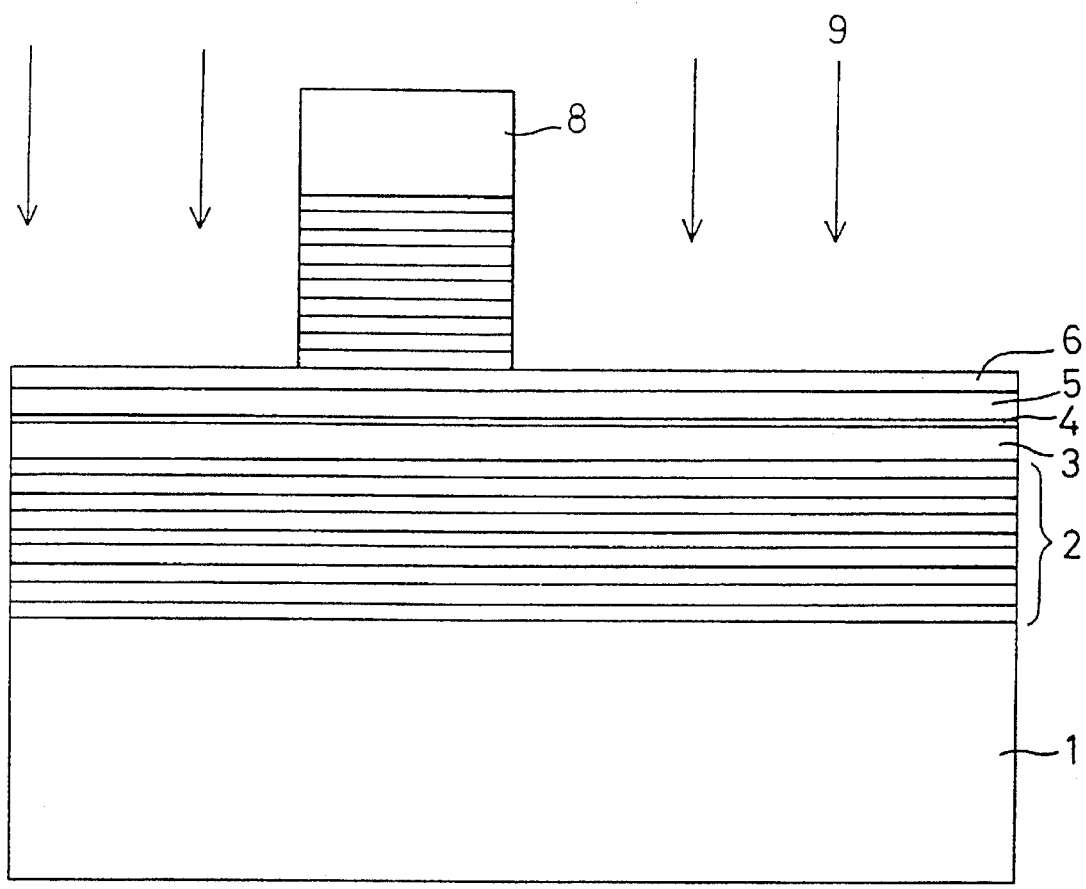
Figure 2D:
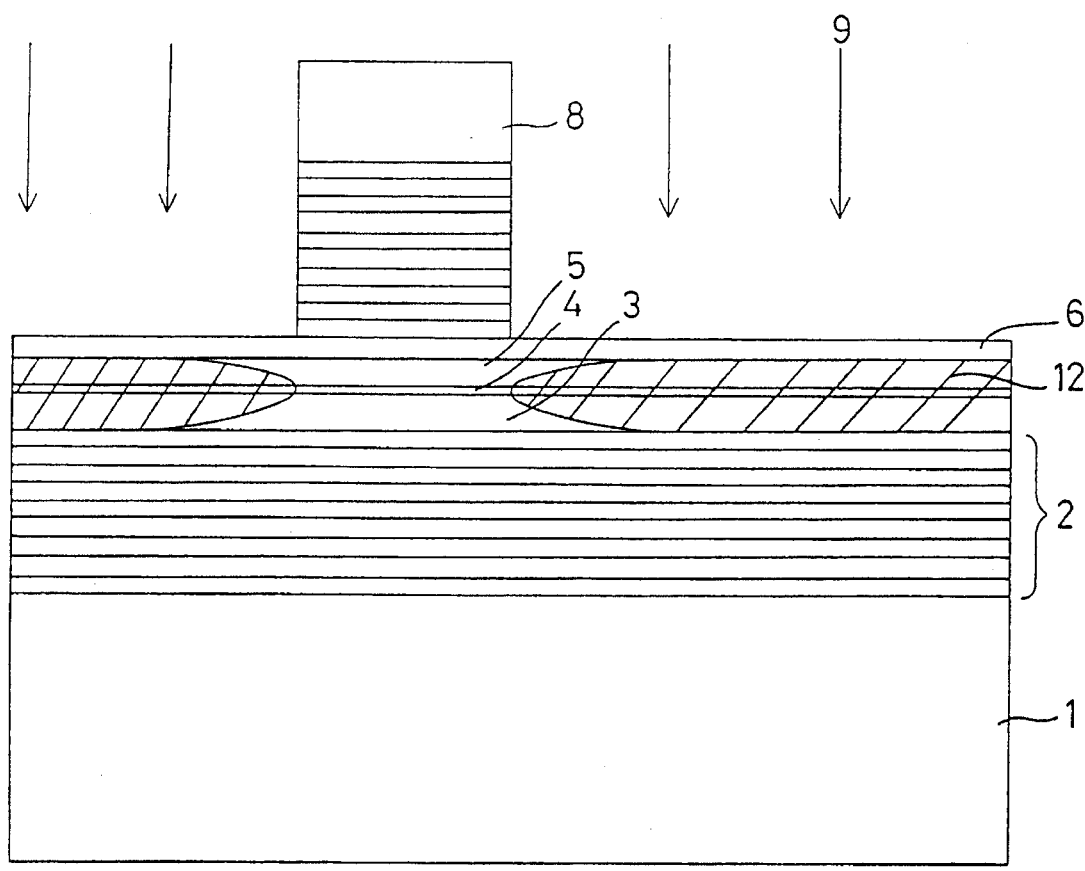
Figure 2E:
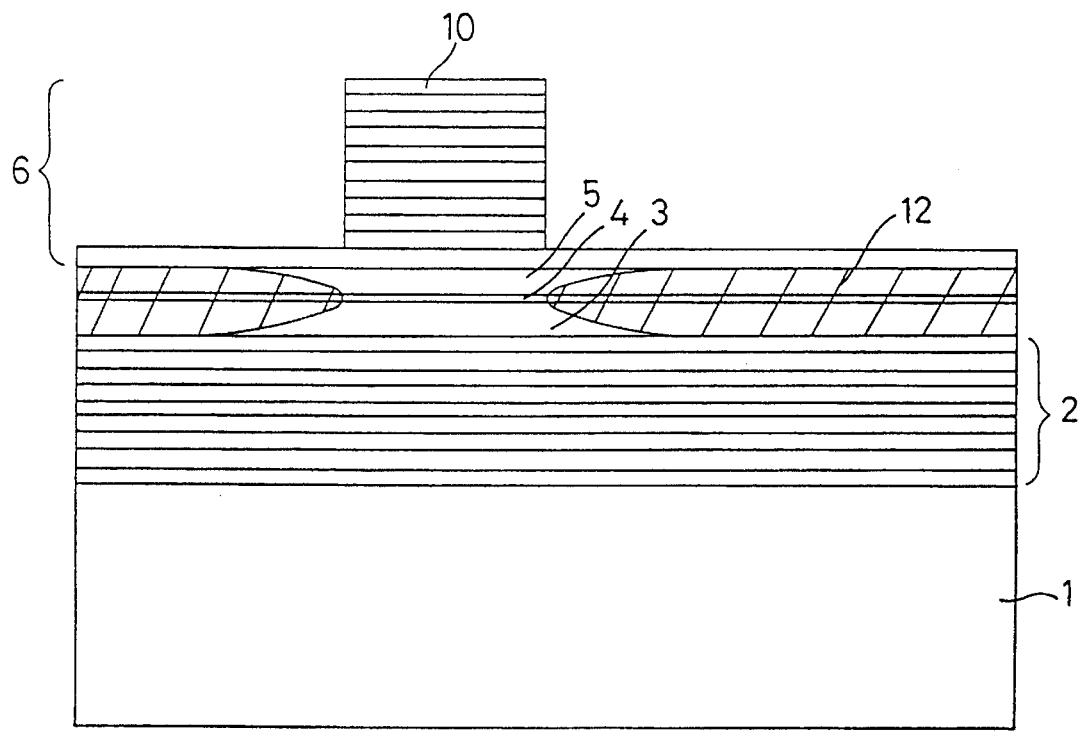
Figure 2F:
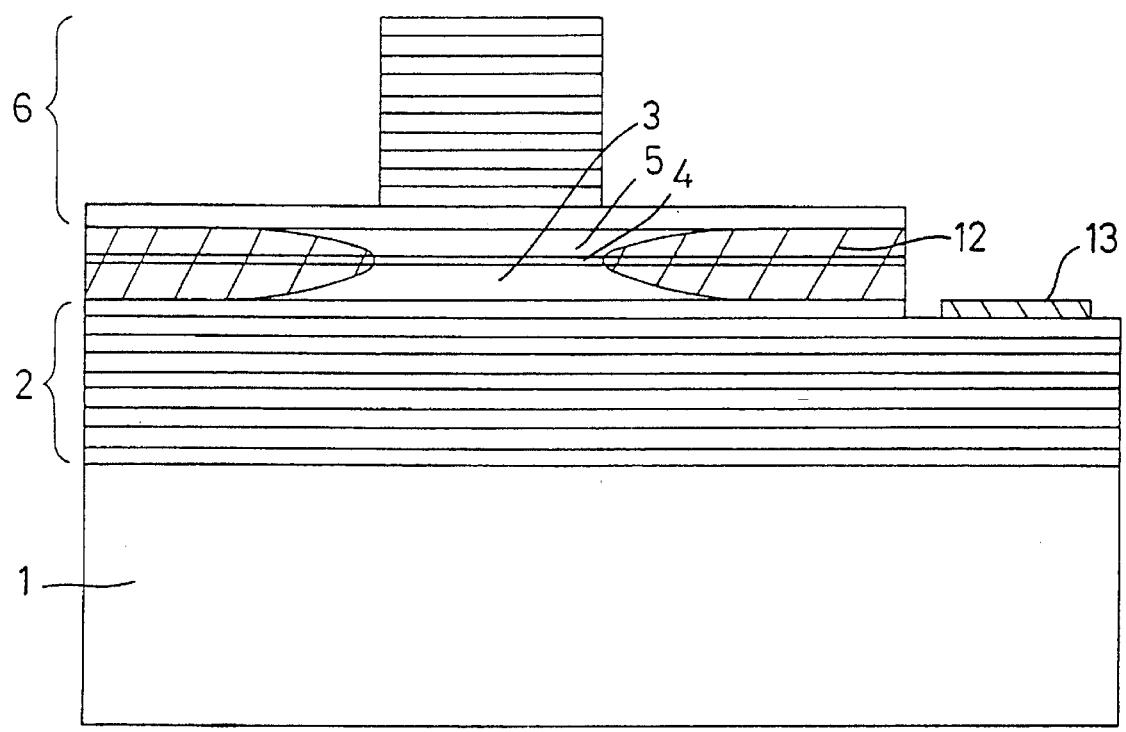
Figure 2G:
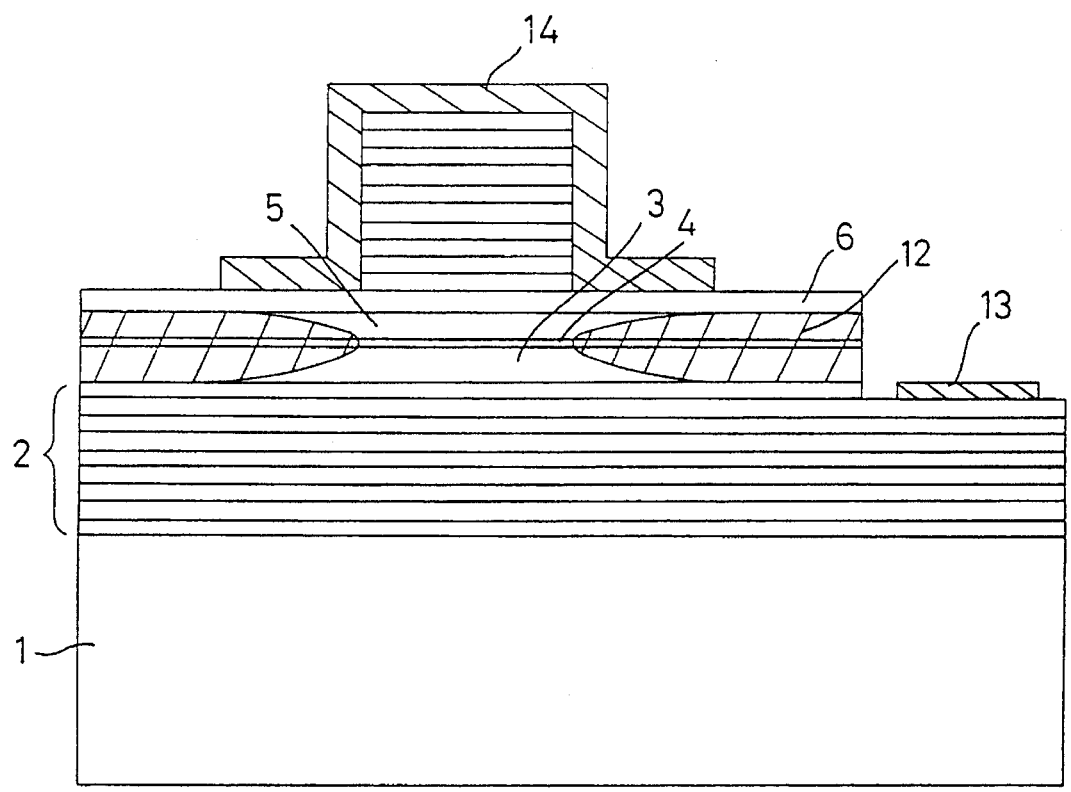
Figure 3:
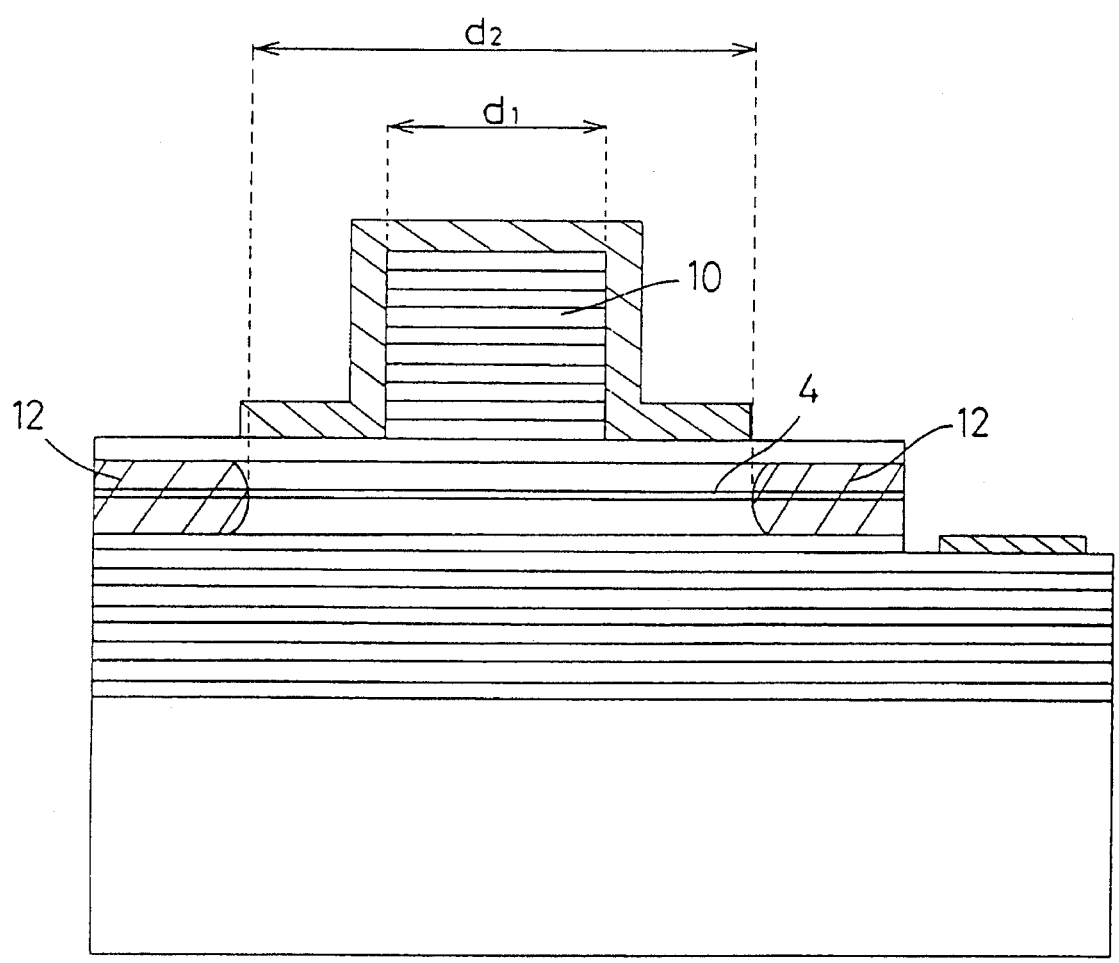
FIG. 3 is a fragmentary cross sectional elevation view illustrative of the structure of the other conventional vertical-to-surface transmission electro-photonic device having the enlarged carrier injection area of the active layer.
Figure 4A:
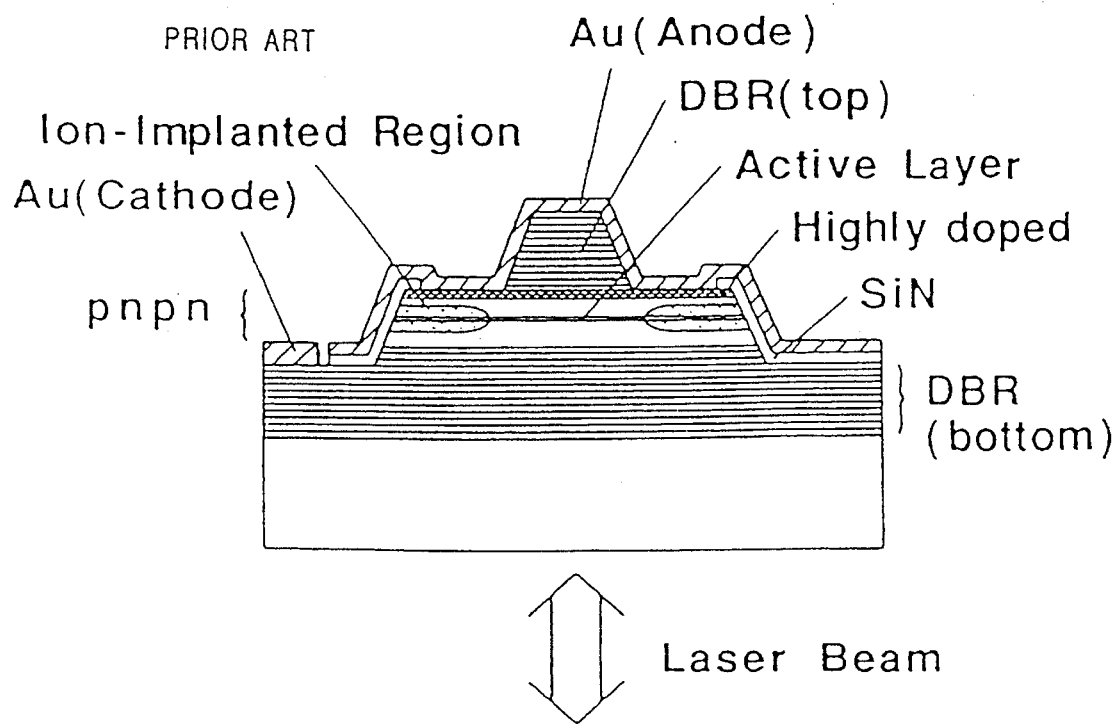
FIG. 4A is a cross sectional elevation view illustrative of the structure of the other conventional vertical-to-surface transmission electro-photonic device having the double mesa structure.
Figure 4B:
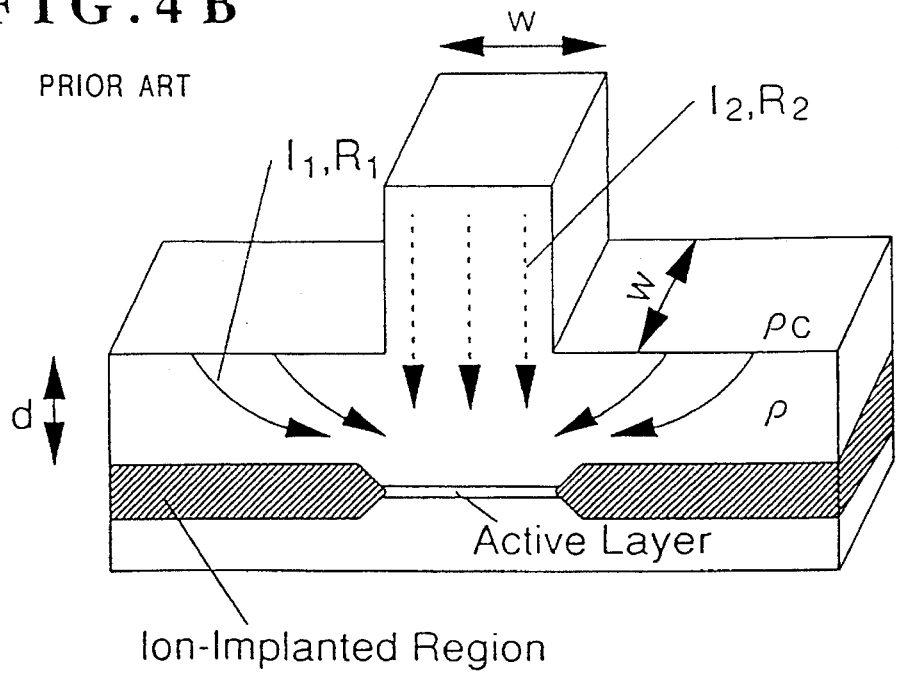
FIG. 4B is a modeled perspective view illustrative of the structure of the conventional vertical-to-surface transmission electro-photonic device illustrated in FIG. 4A.
Figure 5:
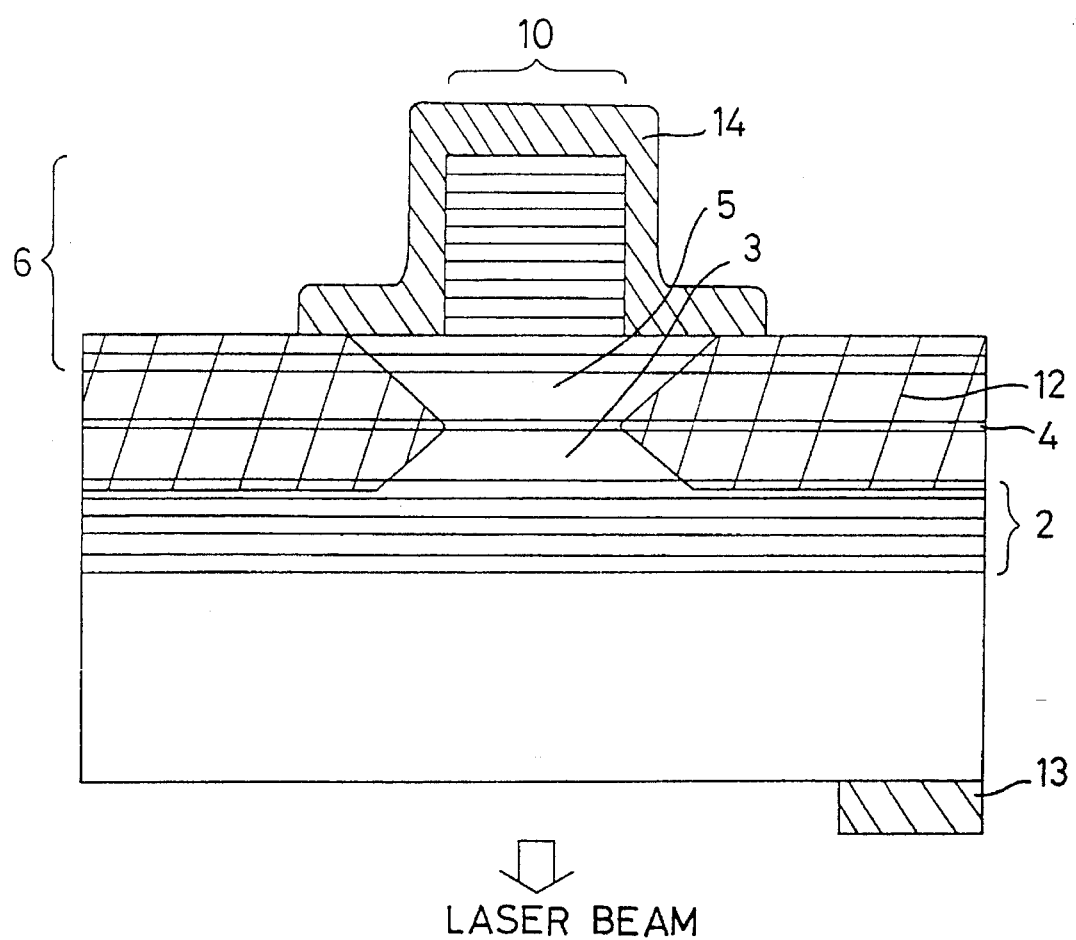
FIG. 5 is a fragmentary cross sectional elevation view illustrative of a structure of a novel vertical-to-surface transmission electro-photonic device of a first embodiment according to the present invention.

A first embodiment according to the present invention provides a novel vertical-to-surface transmission electro-photonic device with a mesa structure, a novel structure of which will hereinafter be described in detail with reference to FIG. 5.

A novel vertical-to-surface transmission electro-photonic device has a semiconductor substrate which is made of an n-GaAs semiconductor compound. A bottom distributed Bragg reflector mirror 2 is provided on a top surface of said n-GaAs semiconductor substrate 1. The bottom distributed Bragg reflector mirror 2 comprises n-GaAs layers and n-AlAs layers which are alternately laminated. The alternating lamination may, for example, comprise five periods of the n-GaAs layers and n-AlAs layers, each of which has a thickness corresponding to a quater of a medium wavelength. The n-GaAs layers and n-AlAs layers have a relatively large difference in those refractive indexes due to those compositional discontinuity to serve as the distributed Bragg reflective mirror for reflecting a light or laser propagated in a vertical direction. The n-GaAs layers and n-AlAs layers with the large difference in the refractive index have also a relatively large discontinuity in the energy band gap due to the compositional discontinuity.

A bottom cladding region 3 made of n-$Al_{0.3}Ga_{0.7}As$ is provided on a top surface of the bottom distributed Bragg reflector mirror 2. As illustrated in FIG. 5, the bottom n-$Al_{0.3}Ga_{0.7}As$ cladding region has a definition of a circular truncated cone whose horizontal size or diameter is gradually and proportionally minimized toward an upper direction. The circular truncated cone definition of the bottom cladding region is completely free from any exposure of an ion-implantation for a formation of a high resistive region for a lateral carrier confinement. Thus, the bottom cladding region having the circular truncated cone definition has an extremely low electrical resistance through which any carrier or electrons are able to flow without any experience of a potential barrier.

An active layer 4 is formed on a top surface of the bottom cladding region 3. The active layer 4 comprises a i-$In_{0.2}Ga_{0.8}As$ layer which forms a quantum well structure. The active layer 4 is defined in a horizontal carrier injection area which corresponds to the top surface area of the bottom cladding region 3.

A top cladding region 5 made of p-$Al_{0.3}Ga_{0.7}As$ is provided on a top surface of the active layer defined in the carrier injection area. As illustrated in FIG. 5, the top p-$Al_{0.3}Ga_{0.7}As$ cladding region 5 has a definition of an inverse circular truncated cone whose horizontal size or diameter is gradually and proportionally enlarged toward the upper direction. The inverse circular truncated cone definition of the top cladding region 5 is completely free from any exposure of an ion-implantation for a formation of a high resistive region for a lateral carrier confinement. Notwithstanding in the prior art the top cladding layer around the mesa structure is unavoidably exposed to the ion-implantation thereby the top cladding layer over the tapering portion of the high resistive region unavoidably has a somewhat high electrical resistivity. In contrast, in the first embodiment according to the present invention, the ion-free top cladding region having the inverse truncated cone definition is able to have an extremely low electrical resistivity. Since the bottom cladding region having the circular truncated cone definition has an extremely low electrical resistance, any carrier or holes are able to flow without any experience of a potential barrier. Since holes as the carrier in the p-type top cladding region 5 have a much larger effective mass than an effective mass of electrons as carriers in the n-type bottom cladding region 3, the extremely low resistivity of the top cladding region having the inverse circular truncated cone definition is much more important for securing a desired low electrical resistance of the device. This is very important to simultaneously secure both a high efficiency in the electronic-optical conversion and a very low device resistance.

An oblique angle of a side surface of the inverse circular truncated cone definition may be, for example, approximately 14° at the included angle to the level surface or the surface of the active layer 4. The oblique angle of the side surface in the inverse circular truncated cone definition of the top cladding region is defined by an oblique angle of an oblique direction ion-implantation for a formation of a high resistive region 12 for a lateral carrier confinement. The high resistive region may comprises a proton implanted region. The high resistive region 12 acting for the lateral carrier confinement is provided to define the inverse circular truncated cone definition of the p-type top cladding region 5, the carrier injection area of the active layer 4 and the circular truncated cone definition of the n-type bottom cladding region 3.

Two pairs of p-GaAs/AlAs layers may be provided on the top surface of the p-type top cladding region 5 having the inverse circular truncated cone definition. The two pairs of the p-GaAs/AlAs layers have an external definition like a flat inverse circular truncated cone smoothly united with the inverse circular truncated cone definition of the p-type top cladding region 5. The p-type top cladding region 5 and the two pairs of the p-GaAs/AlAs layers constitute a united inverse circular truncated cone as illustrated in FIG. 5. Then, a side surface of the flat inverse circular truncated cone definition is defined by the high resistive region 12.

Alternatively, a single pair of p-GaAs/AlAs layers may be provided on the top surface of the p-type top cladding region 5 having the inverse circular truncated cone definition whereas an illustration is omitted. The single pair of the p-GaAs/AlAs layers has an external definition like the inverse circular truncated cone smoothly united with the inverse circular truncated cone definition of the p-type top cladding region 5. The p-type top cladding region 5 and the single pair of the p-GaAs/AlAs layers constitute a united inverse circular truncated cone as illustrated in FIG. 5.

Alternatively, no pair p-GaAs/AlAs layers may be provided on the top surface of the p-type top cladding region 5 having the inverse circular truncated cone definition whereas an illustration is omitted.

Whereas in the above descriptions the above n-type bottom and p-type top cladding regions 3 and 5 have the circular truncated cone and the inverse circular truncated cone definitions, modifications of the definitions thereof are acceptable. For example, the external definitions of the n-type bottom and the p-type top cladding regions may be a truncated pyramid and an inverse truncated pyramid respectively, for example, a quadrilateral truncated pyramid and an inverse quadrilateral truncated pyramid.

A horizontal size or diameter of the inverse truncated pyramid of the p-type top cladding region 5 is gradually and proportionally enlarged toward the upper direction. The inverse truncated pyramid definition of the top cladding region 5 is completely free from any exposure of an ion-implantation for a formation of a high resistive region for a lateral carrier confinement. Notwithstanding in the prior art the top cladding layer around the mesa structure is unavoidably exposed to the ion-implantation thereby the top cladding layer over the tapering portion of the high resistive region unavoidably has a somewhat high electrical resistivity. In contrast, the modification of the first embodiment according to the present invention, the ion-free top cladding region having the inverse truncated cone definition is able to have an extremely low electrical resistivity. Since the bottom cladding region having the truncated pyramid definition has an extremely low electrical resistance, any carrier or holes are able to flow without any experience of a potential barrier. Since holes as the carrier in the p-type top cladding region 5 have a much larger effective mass than an effective mass of electrons as carriers in the n-type bottom cladding region 3, the extremely low resistivity of the top cladding region having the inverse truncated pyramid definition is much more important for securing a desired low electrical resistance of the device. This is very important to simultaneously secure both a high efficiency in the electronic-optical conversion and a very low device resistance.

An oblique angle of a side surface of the inverse truncated pyramid definition may be, for example, approximately 14° at the included angle to the level surface or the surface of the active layer 4. The oblique angle of the side surface of the inverse truncated pyramid definition of the top cladding region is defined by an oblique angle of an oblique direction ion-implantation for a formation of a high resistive region 12 for the lateral carrier confinement. The high resistive region may comprises a proton implanted region. The high resistive region 12 acting for the lateral carrier confinement is provided to define the inverse truncated pyramid definition of the p-type top cladding region 5, the carrier injection area of the active layer 4 and the truncated pyramid definition of the n-type bottom cladding region 3.

Two pairs of p-GaAs/AlAs layers may be provided on the top surface of the p-type top cladding region 5 having the inverse truncated pyramid definition. The two pairs of the p-GaAs/AlAs layers have an external definition like a flat inverse truncated pyramid smoothly united with the inverse truncated pyramid definition of the p-type top cladding region 5. The p-type top cladding region 5 and the two pairs of the p-GaAs/AlAs layers constitute a united inverse truncated pyramid as illustrated in FIG. 5. Then, a side surface of the flat inverse truncated pyramid definition is defined by the high resistive region 12.

The description will hereinafter be back to the first embodiment from the modifications thereof.

A top distributed Bragg reflector mirror 6 comprises p-GaAs layers and p-AlAs layers which are alternately laminated. The alternating lamination may, for example, comprise ten periods of the p-GaAs layers and p-AlAs layers, each of which has the thickness corresponding to a quater of the medium wavelength. The top distributed Bragg reflector mirror 6 is formed on a predetermined area in a top surface of the two pairs p-GaAs/AlAs layers having the inverse circular truncated cone definition in which the predetermined area corresponds to the light emitting area or the carrier injection area of the active layer 4 the top cladding layer 5 in a plane view. This results in that the top distributed Bragg reflector mirror 6 has a mesa structure. The p-GaAs layers and p-AlAs layers have a relatively large difference in those refractive indexes due to a large compositional discontinuity to serve as the distributed Bragg reflective mirror. The p-GaAs layers and p-AlAs layers with the large difference in the refractive index have also a relatively large energy band gap discontinuity due to the large compositional discontinuity.

As modifications of the first embodiment, the above number of the periods for the p-type bottom and the p-type top distributed Bragg reflector mirrors may be changeable to much various conditions.

A p-electrode 14 is formed to cover not only the mesa structure 10 of the top distributed Bragg reflector mirror 6 and its adjacent portions. The p-electrode 14 is provided to cover at least the exposed top surface of the two pairs of the p-GaAs/AlAs layers 6 in which the exposed surface is not covered by the mesa structure of the top distributed Bragg reflector mirror 6. The p-electrode 14 is provided further to cover an edge portion of the top surface of the high resistive region 12. An n-electrode 13 is selectively provided at a peripheral position on a bottom surface of the n-GaAs substrate 1 so that the n-electrode 13 does not cover any light or laser beam emitting area. Alternatively, n-electrode 13 may be designed to have a window through which the light or laser beam is able to be transmitted.

The description of the first embodiment and some modifications thereof will subsequently be directed to fabrication processes for the above novel vertical-to-surface transmission electro-photonic device.

Figure 6A:
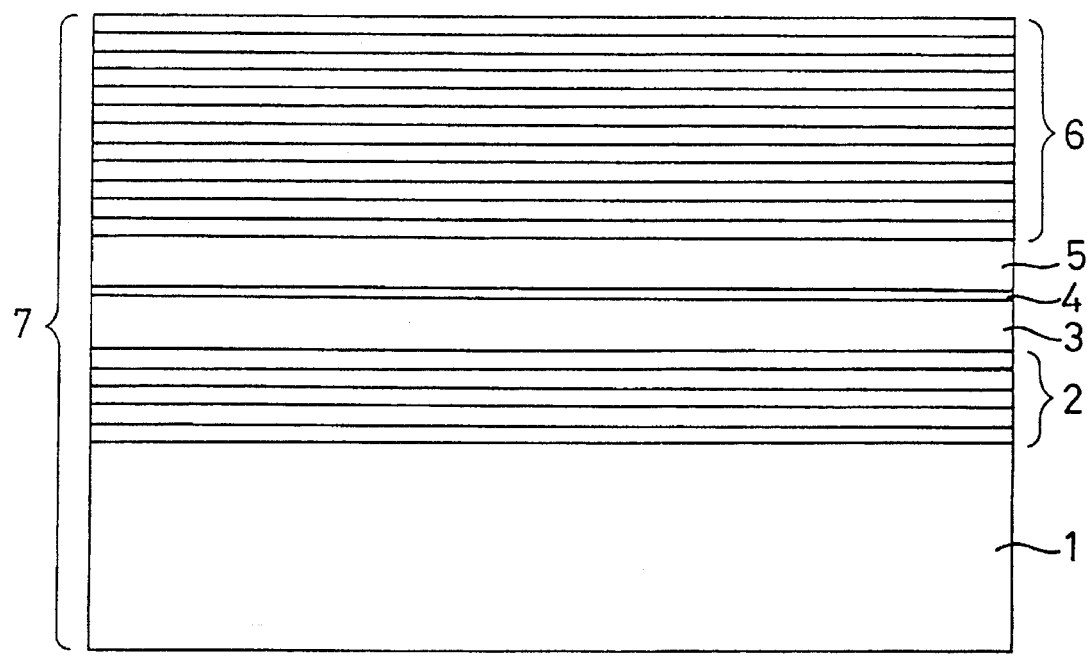

With reference to FIG. 6A, the n-GaAs substrate 1 is prepared and the n-GaAs layers and the n-AlAs layers are epitaxially and alternately grown by molecular beam epitaxy on the top surface of the n-GaAs substrate 1 until the five periods of the alternating laminations of the n-GaAs layers and the n-AlAs layers are formed to serve as the bottom distributed Bragg reflector mirror 2. The n-Al$_{0.3}$Ga$_{0.7}$As epitaxial layer serving as the bottom cladding layer 3 is grown by molecular beam epitaxy on the top surface of the bottom distributed Bragg reflector mirror 2. The non-doped In$_{0.2}$Ga$_{0.8}$As epitaxial layer serving as the active layer 4 is grown on the top surface of the bottom cladding layer 3 by molecular beam epitaxy. The p-Al$_{0.3}$Ga$_{0.7}$As epitaxial layer serving as the top cladding layer 5 is grown on the top surface of the active layer 4 by molecular beam epitaxy. The p-GaAs layers and the p-AlAs layers are epitaxially and alternately grown by molecular beam epitaxy on the top surface of the top p-doped cladding layer 5 until the twelve periods of the alternating laminations of the p-GaAs layers and the p-AlAs layers are 6 formed to serve as the p-doped top distributed Bragg reflector mirror thereby a vertical-to-surface transmission electro-photonic device substrate 7 is completed.

Figure 6B:
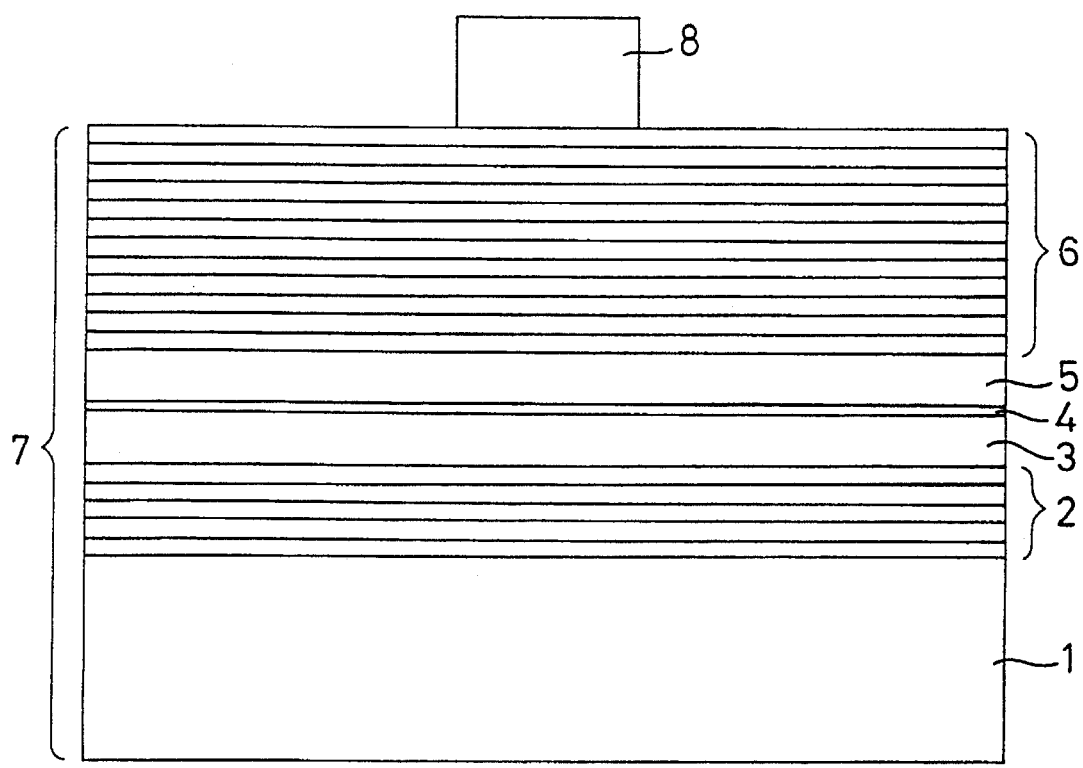

With reference to FIG. 6B, a photo-resist film is formed on a top surface of the p-doped top distributed Bragg reflector 6 in the vertical-to-surface emitting laser substrate 7. The photo-resist film is subjected to patterning to form a photo-resist pattern within a predetermined area to be used for ion-beam etching. The photo-resist pattern has a horizontal size of 10 micrometers square.

Figure 6C:
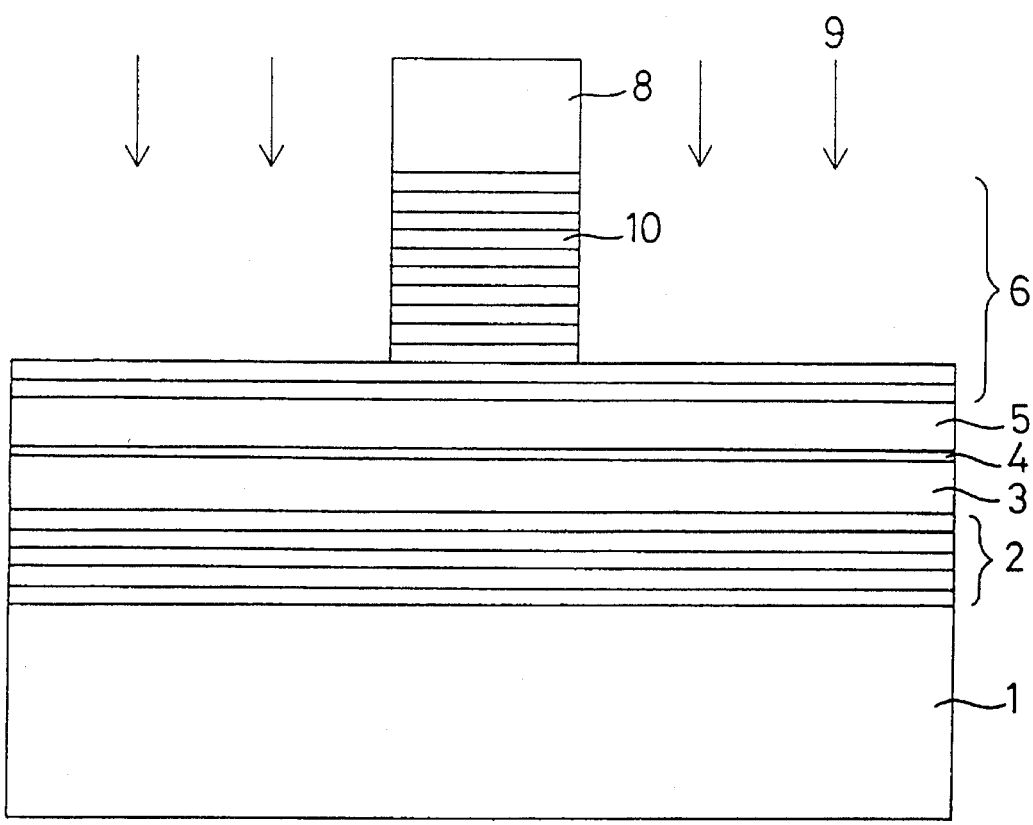

With reference to FIG. 6C, except for the bottom one or two periods of the p-GaAs layers and the p-AlAs layers 6, the alternating laminations of the p-GaAs/AlAs multiple layers 6 to act as the p-doped top distributed Bragg reflector mirror is selectively removed by a reactive ion-etching 9 using a chlorine gas and the photo-resist pattern 8 in a vertical downward direction until the bottom one or two pairs of the p-GaAs/AlAs layers 6 is exposed so that the mesa structure 10 of the p-doped top distributed Bragg reflector 6 is defined under the photo-resist pattern 8. The mesa structure has a rectangular definition. After the selective removal of the alternating laminations of the p-GaAs/AlAs layers 6, the active layer 4 exists at a depth of approximately 5000 angstroms from the exposed surface of the bottom one or two p-GaAs/AlAs layers.

Figure 6D:
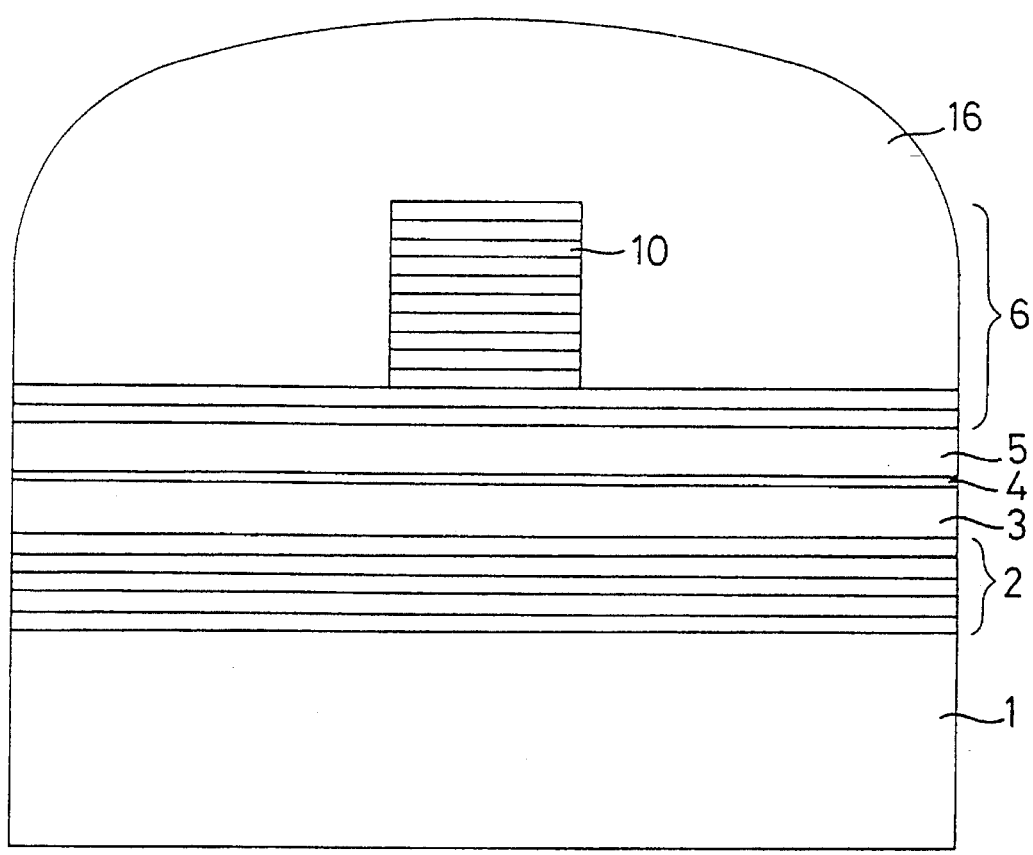

With reference to FIG. 6D, after the reactive ion-etching to form the mesa structure 10 of the top distributed Bragg reflector mirror 6, the photo-resist pattern 8 is removed. A photo-resist material 16 having a high viscosity coefficient is applied on an entire surface of the device until the mesa structure 10 of the top distributed Bragg reflector mirror is at least embedded in the photo-resist material 16 with the high viscosity coefficient.

Figure 6E:
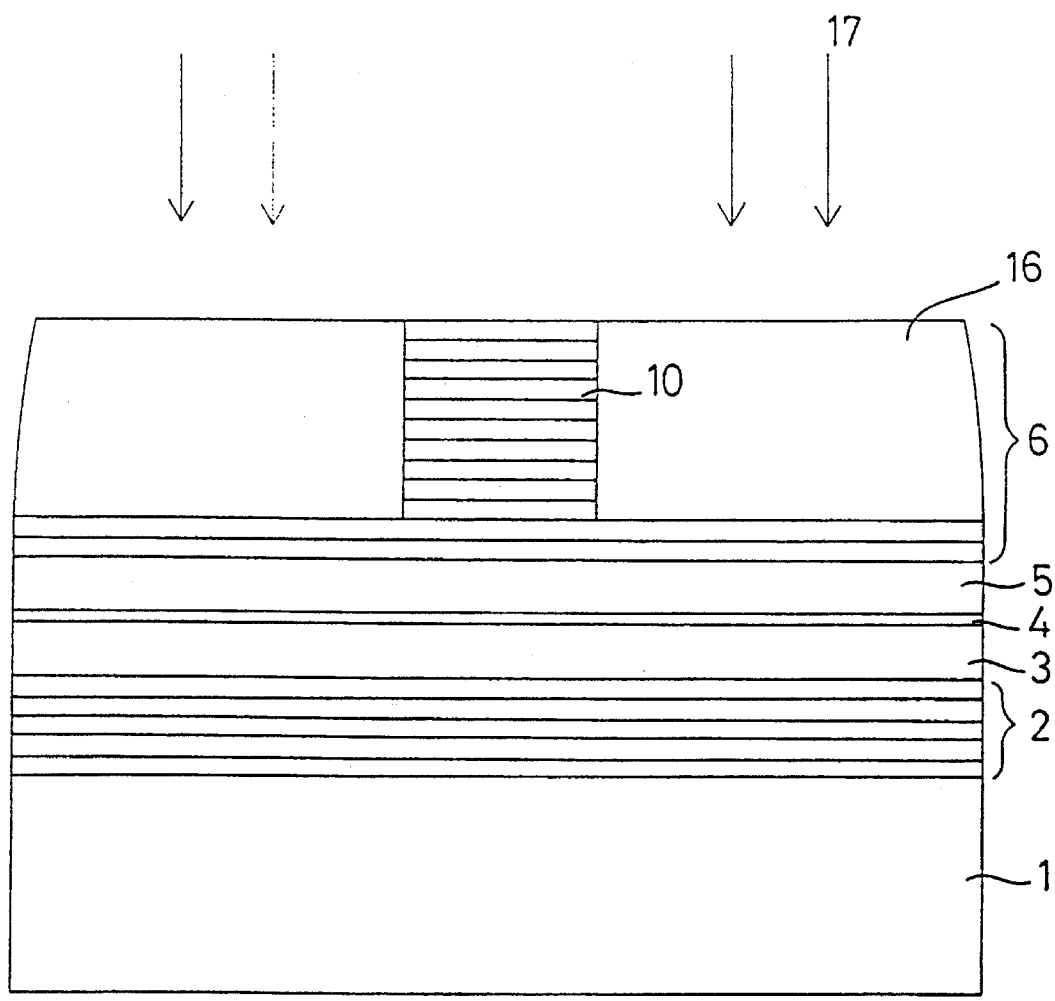

With reference to FIG. 6E, the applied photo-resist material 16 is subjected to a reactive ion-etching 17 with use of oxygen to be removed until the top surface of the mesa structure 10 of the top distributed Bragg reflector mirror is exposed.

Figure 6F:
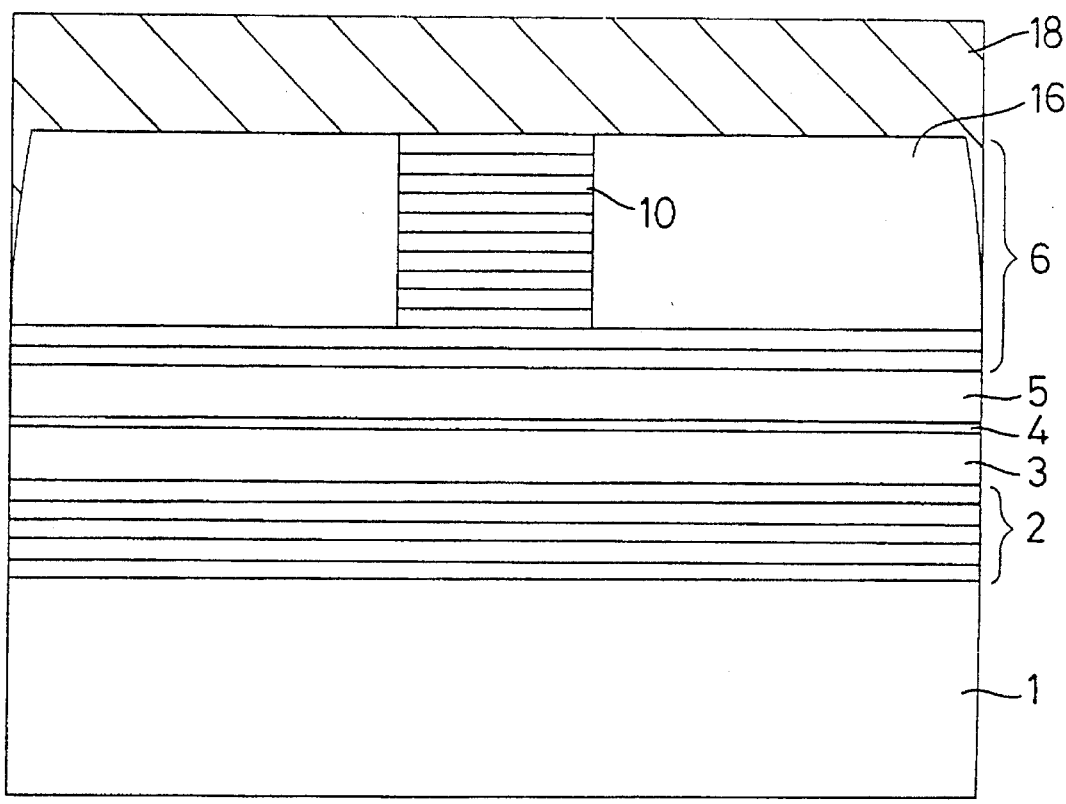

With reference to FIG. 6F, a negative type photo-resist 18 is applied on an entire surface of the device to overlay the exposed surface of the top of the mesa structure 10 of the top distributed Bragg reflector mirror and the surface of the remaining photo-resist material 16 having the high viscosity efficiency. The negative type photo-resist 18 is relatively thick and has a resistivity to any ion-implantation.

Figure 6G:
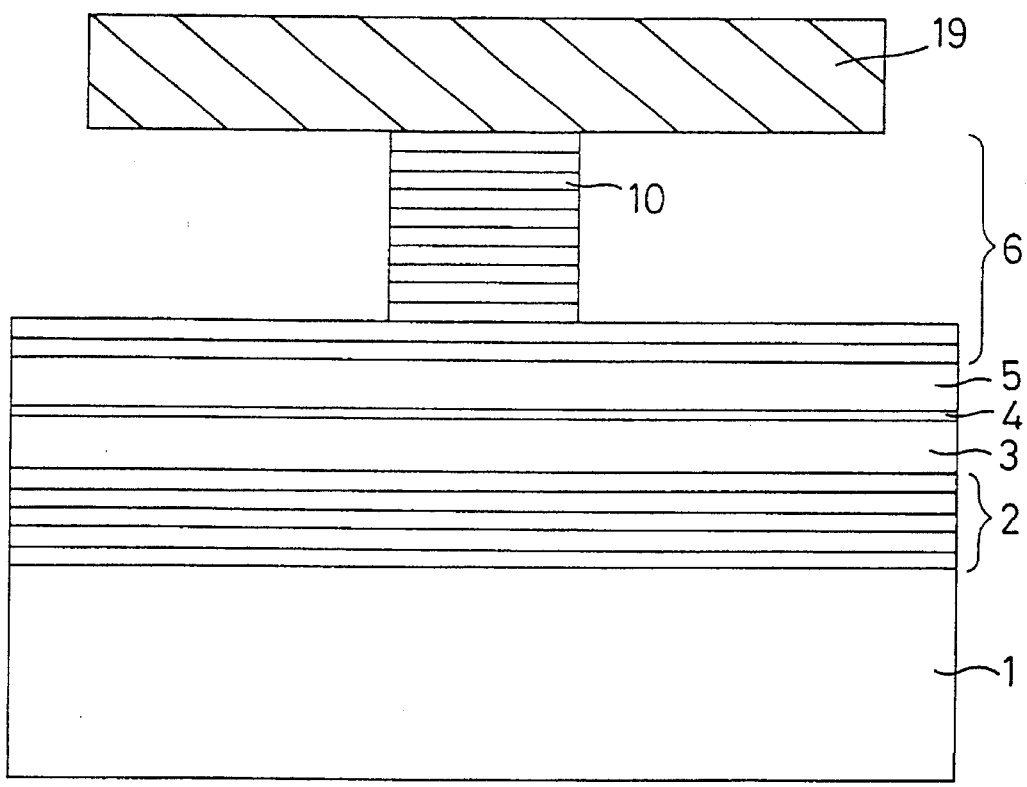
Figure 61:
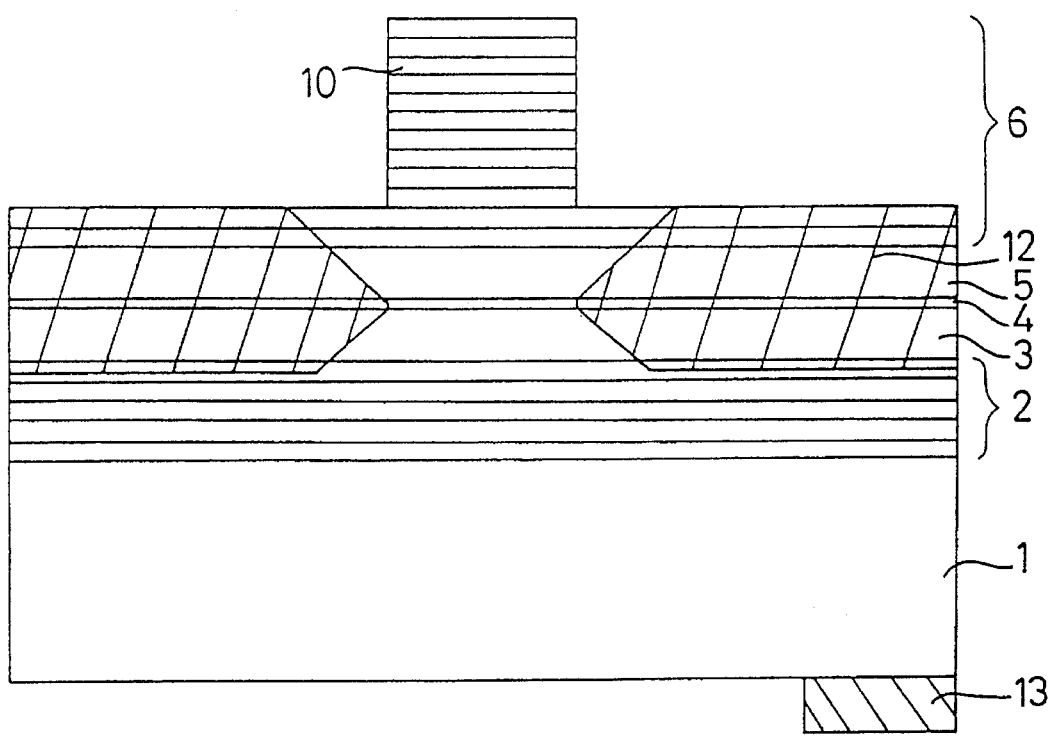

With reference to FIG. 6G, the negative type photo-resist 18 is subjected to a patterning to form a negative photo-resist pattern 19 acting as a mask for subsequent ion-implantation to form a high resistive region. The negative photo-resist pattern 19 has a predetermined horizontal size. For example, the negative photo-resist pattern 19 has a square definition whose horizontal length is 30 micrometers in the plane view. The negative photo-resist pattern 19 is expanded in the horizontal direction by 10 micrometers from the mesa structure 10 at each side. After a post baking, only the remaining photo-resist material 16 having the high viscosity efficiency is completely removed by use of a developing solution for a positive type photo-resist. The negative type photo-resist pattern 19 having a larger horizontal size than a horizontal size of the mesa structure 10 is formed on the top of the mesa structure 10 of the top distributed Bragg reflector mirror.

With reference to FIG. 6H, an ion-implantation 11 of the proton in an oblique direction is accomplished by use of the negative photo-resist pattern 19 during a rotation of the substrate 1 to form a high resistive region of a proton implanted region. The oblique direction for the ion-implantation 11 has an included angle of 14° to a level surface of the active layer 4, namely an included angle of 76° to a vertical axis. The ion-implantation 11 of proton is accomplished under the conditions that an energy of implantation is 300 KeV and a dose of is $5 \times 10^{14}$ cm$^{-2}$. The high resistive region 12 comprising the proton implanted region has a desired proton concentration profile along a vertical direction, which has a peak at the depth of approximately 5000 angstroms from the exposed surface of the bottom two pairs of the p-GaAs/AlAs layers 6. Namely, the proton concentration profile of the high resistive region 12 has a peak at the depth at which the active layer 4 exists. The oblique direction ion-implantation forms the high resistive region 12 of the proton implanted region which defines the light emitting area or the carrier injection area of the active layer 4 in which the carrier injection area corresponds to an area in which the mesa structure 10 is formed in the plane view. The oblique direction ion-implantation also forms the high resistive region 12 of the proton implanted region which defines the united inverse circular truncated cone definition of the p-type top cladding region and the bottom two pairs of the p-GaAs/AlAs layers. The oblique direction ion-implantation also forms the high resistive region 12 of the proton implanted region which defines the circular truncated cone definition of the n-type bottom cladding region.

Cotrary to the vertical downward ion-implantation for formation of the high resistive proton implanted region in the above prior arts, in this oblique angle ion-implantation, proton is implanted into the high resistive region 12 neither through any part of the p-type top cladding region having the inverse circular truncated cone definition nor through any part of the p-GaAs/AlAs layers having the united inverse circular truncated cone definition, which could readily be understood from FIG. 6H. Needless to say, after the proton implantation, none of proton exists not only in the inverse circular truncated cone definition of the p-type top cladding region and the p-GaAs/AlAs layers but also in the light emitting area or the carrier injection area as well as in the circular truncated cone definition of the n-type bottom cladding region. The inverse circular truncated cone and circular truncated cone definitions of the p-type top cladding region and the p-GaAs/AlAs layers and the n-type bottom cladding region are completely free from any exposure of the ion-implantation of proton and thus the above regions are able to have extremely low electrical resistivities. The carriers or electrons and holes are able to flow through the inverse and non-inverse circular truncated cone definition regions of the p-type top and n-type bottom cladding regions without any experience of a potential barrier.

Figure 7:
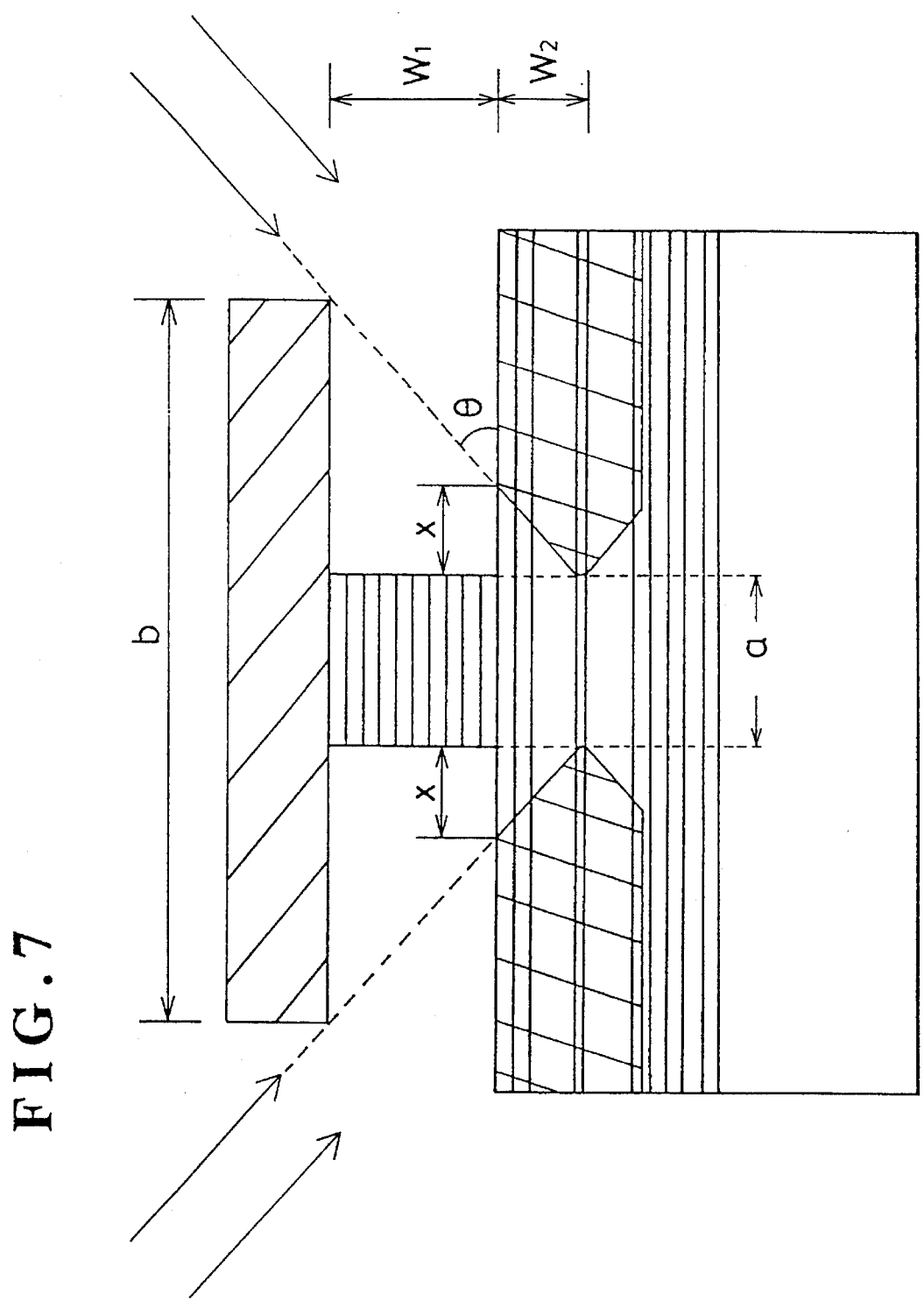
FIG. 7 is a fragmentary cross sectional elevation view illustrative of a relationship between a horizontal mask size and an oblique angle for an ion-implantation in a fabrication process for a high resistive region involved in a novel vertical-to-surface transmission electro-photonic device according to the present invention.

The description of the fabrication processes of the novel device will be directed to a relationship between the horizontal size of the negative type photo-resist pattern 19 and the oblique angle for the oblique directional ion-implantation to form the high resistive region 12. From FIG. 7, it could be understood that the oblique angle and the horizontal size of the negative photo-resist pattern 19 for the oblique directional ion-implantation are respectively defined to comply with the following conditions.

$$b = (2 \times (W_1 + W_2)/W_2) + a$$

$$\theta = \tan^{-1}(W_2 + x)$$

where "b" is the horizontal size of the negative type photo-resist pattern 19, θ is the oblique angle as an included angle to the level line, "$W_1$" is a height of the mesa structure 10. "$W_2$" is the depth of the active layer 4 from the flat surface of the device around the mesa structure 10, "a" is the horizontal size of the light emitting area or the carrier injection area of the active layer 4, which corresponds to a horizontal size of the mesa structure 10 and "x" is the horizontal distance of an edge of the top surface of the inverse circular truncated cone definition region from the side of the mesa structure 10.

Whereas in the above descriptions the above n-type bottom and p-type top cladding regions 3 and 5 have the circular truncated cone and the inverse circular truncated cone definitions, modifications of the definitions thereof are acceptable. For example, the external definitions of the n-type bottom and the p-type top cladding regions may be a truncated pyramid and an inverse truncated pyramid respectively, for example, a quadrilateral truncated pyramid and an inverse quadrilateral truncated pyramid. In this case, the oblique directional ion-implantation of proton is accomplished by use of the negative photo-resist pattern 19 during a stationary state of the device. The oblique directional ion-implantation of proton is discontinued during a rotation of the substrate 1 by a predetermined angle. The above two steps are repeated in required times. The oblique direction for the ion-implantation 11 has an included angle of 14° to a level surface of the active layer 4, namely an included angle of 76° to a vertical axis. The ion-implantation 11 of proton is accomplished under the conditions that an energy of implantation is 300 KeV and a dose of is $5 \times 10^{14}$ cm$^{-2}$. The high resistive region 12 comprising the proton implanted region has a desired proton concentration profile along a vertical direction, which has a peak at the depth of approximately 5000 angstroms from the exposed surface of the bottom two pairs of the p-GaAs/AlAs layers 6. Namely, the proton concentration profile of the high resistive region 12 has a peak at the depth at which the active layer 4 exists. The oblique direction ion-implantation forms the high resistive region 12 of the proton implanted region which defines the light emitting area or the carrier injection area of the active layer 4 in which the carrier injection area corresponds to an area in which the mesa structure 10 is formed in the plane view. The oblique direction ion-implantation also forms the high resistive region 12 of the proton implanted region which defines the united inverse truncated pyramid definition of the p-type top cladding region and the bottom two pairs of the p-GaAs/AlAs layers. The oblique direction ion-implantation also forms the high resistive region 12 of the proton implanted region which defines the truncated pyramid definition of the n-type bottom cladding region.

The description will be back to the fabrication process for the device from the modifications thereof.

With reference to FIG. 6I, the negative photo-resist pattern 19 is removed. An n-electrode 13 is selectively provided at a peripheral position on a bottom surface of the n-GaAs substrate 1 so that the n-electrode 13 does not cover any light or laser beam emitting area. Alternatively, n-electrode 13 may be designed to have a window through which the light or laser beam is able to be transmitted.

Figure 6J:
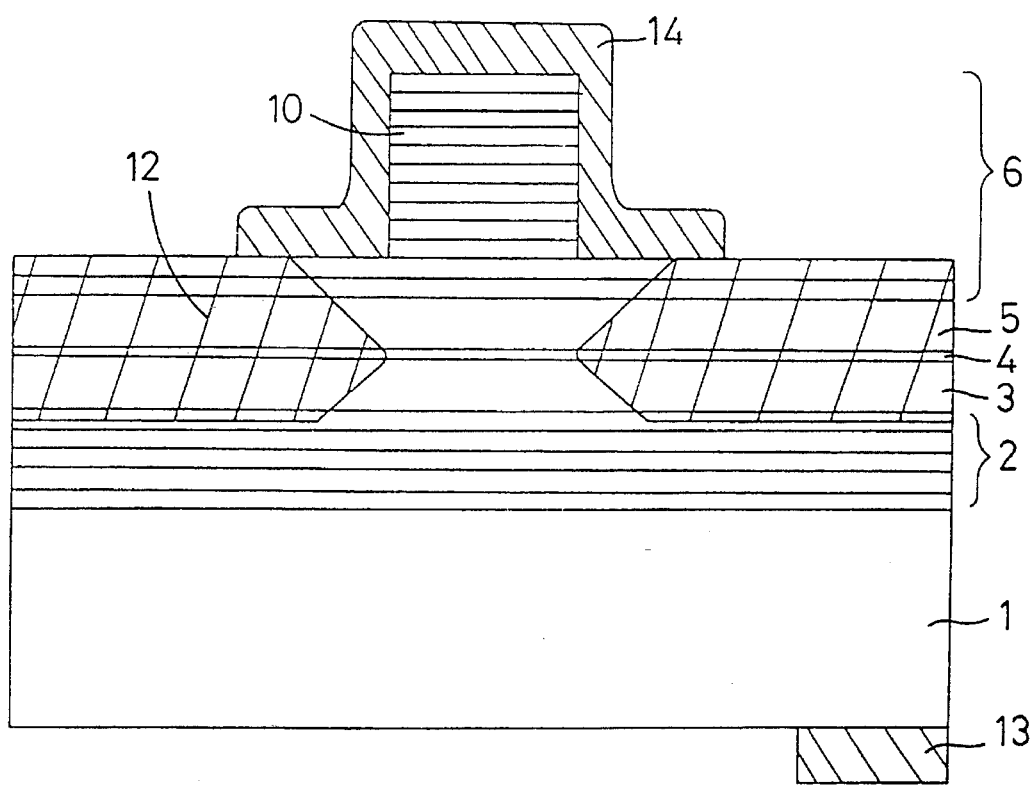

With reference to FIG. 6J, a p-electrode 14 is formed to cover not only the mesa structure 10 of the top distributed Bragg reflector mirror 6 and its adjacent portions. The p-electrode 14 is provided to cover at least the exposed top surface of the two pairs of the p-GaAs/AlAs layers 6 in which the exposed surface is not covered by the mesa structure of the top distributed Bragg reflector mirror 6. The p-electrode 14 is provided further to cover an edge portion of the top surface of the high resistive region 12.

The negative carriers or electrons may be able to be injected from the n-electrode 13 into the active layer 4 in the carrier injection area through the circular truncated cone definition region of the n-type bottom cladding region in which the electrons have experienced no potential barrier. Further, the positive carrier or holes may also be able to be injected from the p-electrode 14 at its peripheral portion of the mesa structure 10 into the active layer 4 in the carrier injection area through the inverse circular truncated cone definition region of the p-type bottom cladding region in which the holes have experienced no potential barrier. It is much more important for reduction of the device electrical resistance that the holes have experienced no potential barrier during flowing through the inverse circular truncated cone definition region of the p-type top cladding region since holes have a much larger effective mass than an effective mass of electrons.

The novel vertical-to-surface transmission electro-photonic device, therefore, has the following advantages. A large part of the injection carriers or holes flows from the p-electrode at the peripheral portion of the mesa structure 10 through the ion-free inverse circular truncated cone definition region toward the light emitting area in the active layer 4 and receives the carrier confinement by the high resistive regions 12 of the proton implanted regions. Namely, a large part of the injection carriers flows not through the mesa structure 10.

From the above, it could readily be appreciated that the above ion-free inverse circular truncated cone definition region defined by the oblique angle ion-implantation is able to permit a remarkable reduction of the electrical resistance of the vertical-to-surface transmission electro-photonic device. The above desired definition of the high resistive region 12 is also able to permit the lateral carrier confinement which provides the high density carrier injection into the active layer 4. The high density carrier injection provides a strong laser beam emission from the active layer 4 in the vertical direction to the surface thereof. This leads to a remarkable improvement in the electronic-optical conversion efficiency of the vertical-to-surface transmission electro-photonic device. The novel vertical-to-surface transmission electro-photonic device further is able to show remarkably improved excellent properties in an external differential quantum efficiency and a threshold current due to that the device having an extremely low electrical resistance is free from any problems caused by a heat.

A second embodiment according to the present invention provides a novel vertical-to-surface transmission electro-photonic device with a mesa structure, a novel structure of which will hereinafter be described in detail with reference to FIGS. 8 and 9.

Figure 8:
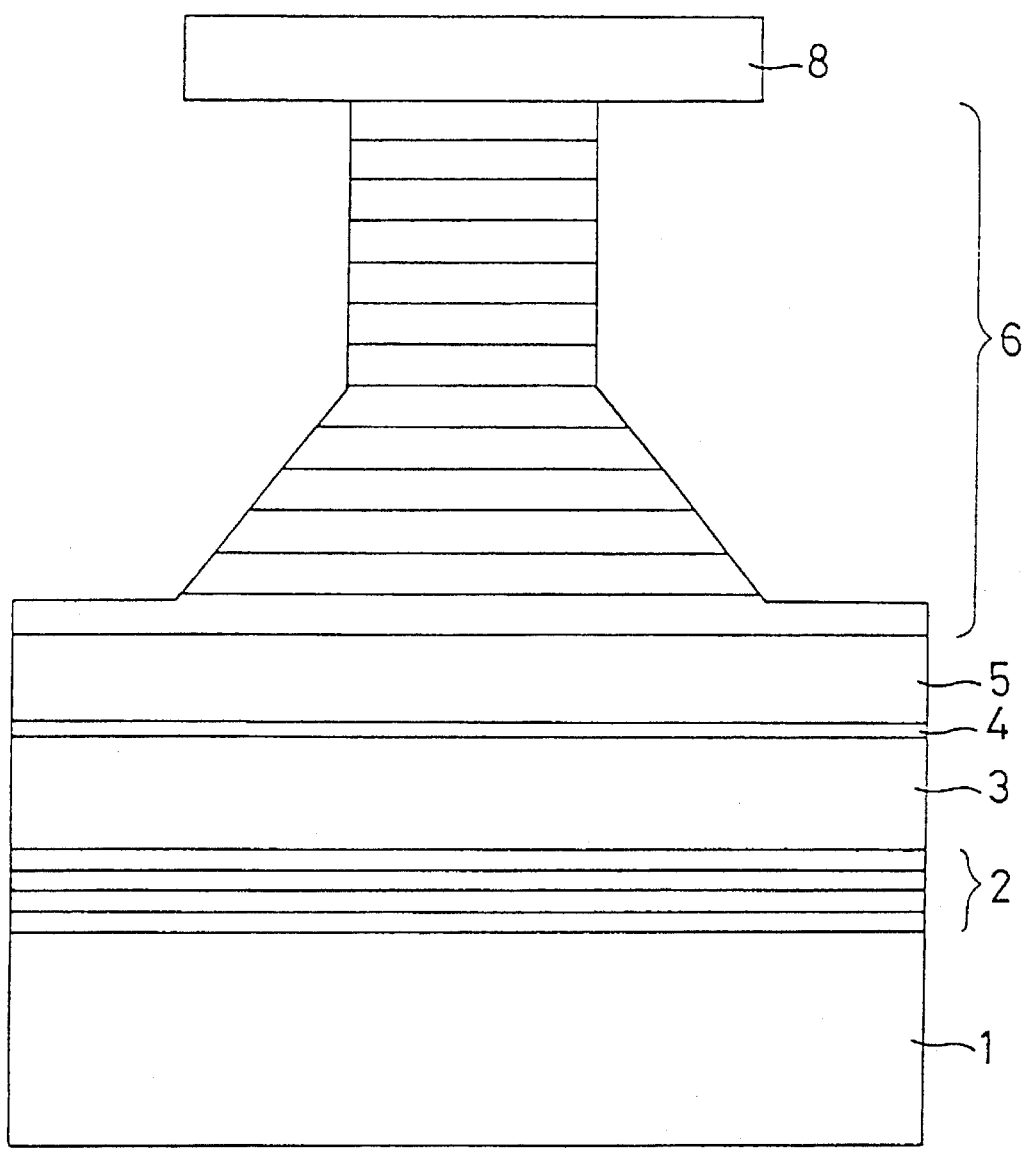
FIG. 8 is a fragmentary cross sectional elevation view illustrative of a step involved in a novel method for fabricating a novel vertical-to-surface transmission electro-photonic device of a second embodiment according to the present invention.

FIG. 8 illustrates a fabrication step involved in a fabrication method for a novel vertical-to-surface transmission electro-photonic device of the second embodiment according to the present invention.

Figure 9:
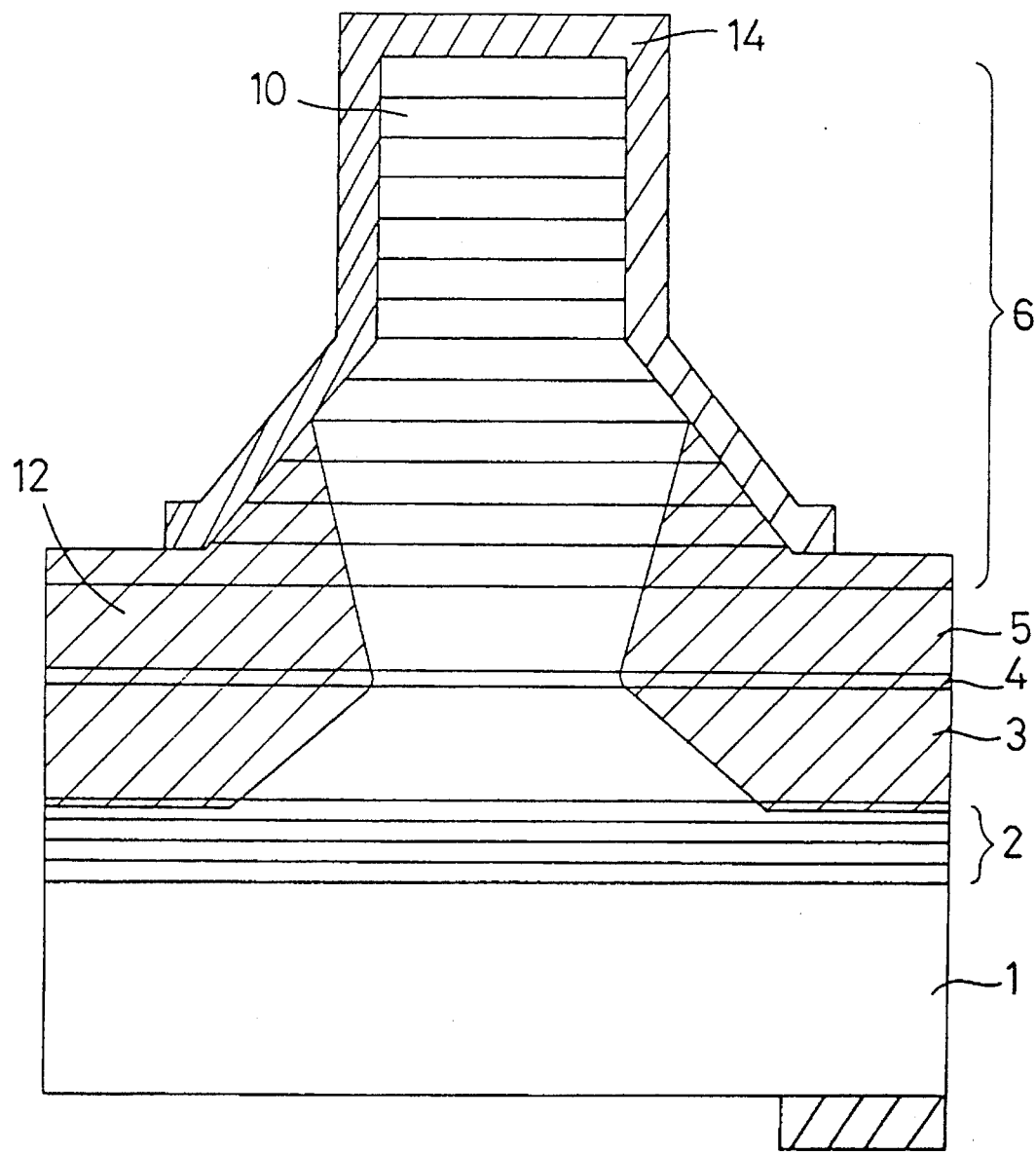
FIG. 9 is a fragmentary cross sectional elevation view illustrative of a structure of a novel vertical-to-surface transmission electro-photonic device of a second embodiment according to the present invention.

As illustrated in FIG. 9, a novel vertical-to-surface transmission electro-photonic device has a semiconductor substrate 1 which is made of an n-GaAs semiconductor compound. A bottom distributed Bragg reflector mirror 2 is provided on a top surface of said n-GaAs semiconductor substrate 1. The bottom distributed Bragg reflector mirror 2 comprises n-GaAs layers and n-AlAs layers which are alternately laminated. The alternating lamination may, for example, comprise four periods of the n-GaAs layers and n-AlAs layers, each of which has a thickness corresponding to a quater of a medium wavelength. The n-GaAs layers and n-AlAs layers have a relatively large difference to those refractive indexes due to those compositional discontinuity to serve as the distributed Bragg reflective mirror for reflecting a light or laser propagated in a vertical direction. The n-GaAs layers and n-AlAs layers with the large difference in the refractive index have also a relatively large discontinuity in the energy band gap due to the compositional discontinuity.

A bottom cladding region 3 made of n-$Al_{0.3}Ga_{0.7}As$ is provided on a top surface of the bottom distributed Bragg reflector mirror 2. As illustrated in FIG. 5, the bottom n-$Al_{0.3}Ga_{0.7}As$ cladding region has a definition of a circular truncated cone whose horizontal size or diameter is gradually and proportionally minimized toward an upper direction. The circular truncated cone definition of the bottom cladding region is completely free from any exposure of an ion-implantation for a formation of a high resistive region for a lateral carrier confinement. Thus, the bottom cladding region having the circular truncated cone definition has an extremely low electrical resistance through which any carrier or electrons are able to flow without any experience of a potential barrier.

An active layer 4 is formed on a top surface of the bottom cladding region 3. The active layer 4 comprises an i-$In_{0.2}Ga_{0.8}As$ layer which forms a quantum well structure. The active layer 4 is defined in a horizontal carrier injection area which corresponds to the top surface area of the bottom cladding region 3.

A top cladding region 5 made of p-$Al_{0.3}Ga_{0.7}As$ is provided on a top surface of the active layer defined in the carrier injection area. As illustrated in FIG. 5, the top p-$Al_{0.3}Ga_{0.7}As$ cladding region 5 has a definition of an inverse circular truncated cone whose horizontal size or diameter is gradually and proportionally enlarged toward the upper direction. The inverse circular truncated cone definition of the top cladding region 5 is completely free from any exposure of an ion-implantation for a formation of a high resistive region for a lateral carrier confinement. Notwithstanding in the prior art the top cladding layer around the mesa structure is unavoidably exposed to the ion-implantation thereby the top region unavoidably has a somewhat high electrical resistivity. In contrast, in the second embodiment according to the present invention, the ion-free top cladding region having the inverse truncated cone definition is able to have an extremely low electrical resistivity. Since the bottom cladding region having the circular truncated cone definition has an extremely low electrical resistance, any carrier or holes are able to flow without any experience of a potential barrier. Since holes as the carrier in the p-type top cladding region 5 have a much larger effective mass than an effective mass of electrons as carriers in the n-type bottom cladding region 3, the extremely low resistivity of the top cladding region having the inverse circular truncated cone definition is much more important for securing a desired low electrical resistance of the device. This is very important to simultaneously secure both a high efficiency in the electronic-optical conversion and a very low device resistance.

An oblique angle of a side surface of the inverse circular truncated cone definition may be a desired angle to match various conditions. The oblique angle of the side surface of the inverse circular truncated cone definition of the top cladding region is defined by an oblique angle of an oblique direction ion-implantation for a formation of a high resistive region 12 for a lateral carrier confinement. The high resistive region may comprises a proton implanted region. The high resistive region 12 acting for the lateral carrier confinement is provided to define the inverse circular truncated cone definition of the p-type top cladding region 5, the carrier injection area of the active layer 4 and the circular truncated cone definition of the n-type bottom cladding region 3.

Four pairs of p-GaAs/AlAs layers may be provided on the top surface of the p-type top cladding region 5 having the inverse circular truncated cone definition. The four pairs of the p-GaAs/AlAs layers have an external definition like a flat inverse circular truncated cone smoothly united with the inverse circular truncated cone definition of the p-type top cladding region 5. The p-type top cladding region 5 and the four pairs of the p-GaAs/AlAs layers constitute a united inverse circular truncated cone as illustrated in FIG. 9. Then, a side surface of the flat inverse circular truncated cone definition is defined by the high resistive region 12.

Alternatively, a single pair of p-GaAs/AlAs layer may be provided on the top surface of the p-type top cladding region 5 having the inverse circular truncated cone definition whereas an illustration is omitted. The single pair of the p-GaAs/AlAs layers has an external definition like the inverse circular truncated cone smoothly united with the inverse circular truncated cone definition of the p-type top cladding region 5. The p-type top cladding region 5 and the single pair of the p-GaAs/AlAs layers constitute a united inverse circular truncated cone as illustrated in FIG. 9.

Alternatively, no pair p-GaAs/AlAs layers may be provided on the top surface of the p-type top cladding region 5 having the inverse circular truncated cone definition whereas an illustration is omitted.

Whereas in the above descriptions the above n-type bottom and p-type top cladding regions 3 and 5 have the circular truncated cone and the inverse circular truncated cone definitions, modifications of the definitions thereof are acceptable. For example, the external definitions of the n-type bottom and the p-type top cladding regions may be a truncated pyramid and an inverse truncated pyramid respectively, for example, a quadrilateral truncated pyramid and an inverse quadrilateral truncated pyramid.

A horizontal size or diameter of the inverse truncated pyramid of the p-type top cladding region 5 is gradually and proportionally enlarged toward the upper direction. The inverse truncated pyramid definition of the top cladding region 5 is completely free from any exposure of an ion-implantation for a formation of a high resistive region for a lateral carrier confinement. Notwithstanding in the prior art the top cladding layer around the mesa structure is unavoidably exposed to the ion-implantation thereby the top cladding layer over the tapering portion of the high resistive region unavoidably has a somewhat high electrical resistivity. In contrast, the modification of the second embodiment according to the present invention, the ion-free top cladding region having the inverse truncated cone definition is able to have an extremely low electrical resistivity. Since the bottom cladding region having the truncated cone definition has an extremely low electrical resistance, any carrier or holes are able to flow without any experience of a potential barrier. Since holes as the carrier in the p-type top cladding region 5 have a much larger effective mass than an effective mass of electrons as carriers in the n-type bottom cladding region 3, the extremely low resistivity of the top cladding region having the inverse truncated pyramid definition is much more important for securing a desired low electrical resistance of the device. This is very important to simultaneously secure both a high efficiency in the electronic-optical conversion and a very low device resistance.

An oblique angle of a side surface of the inverse truncated pyramid definition may be defined to match various conditions. The oblique angle of the side surface of the inverse truncated pyramid definition of the top cladding region is defined by an oblique angle of an oblique direction ion-implantation for a formation of a high resistive region 12 for the lateral carrier confinement. The high resistive region may comprises a proton implanted region. The high resistive region 12 acting for the lateral carrier confinement is provided to define the inverse truncated pyramid definition of the p-type top cladding region 5, the carrier injection area of the active layer 4 and the truncated pyramid definition of the n-type bottom cladding region 3.

Four pairs of p-GaAs/AlAs layers may be provided on the top surface of the p-type top cladding region 5 having the inverse truncated pyramid definition. The four pairs of the p-GaAs/AlAs layers have an external definition like a flat inverse truncated pyramid smoothly united with the inverse truncated pyramid definition of the p-type top cladding region 5. The p-type top cladding region 5 and the four pairs of the p-GaAs/AlAs layers constitute a united inverse truncated pyramid as illustrated in FIG. 9. Then, a side surface of the flat inverse truncated pyramid definition is defined by the high resistive region 12.

The description will hereinafter be back to the second embodiment from the modifications thereof.

A top distributed Bragg reflector mirror 6 comprises p-GaAs layers and p-AlAs layers which are alternately laminated. The alternating lamination may, for example, comprise thirteen periods of the p-GaAs layers and p-AlAs layers, each of which has the thickness corresponding to a quater of the medium wavelength. The top distributed Bragg reflector mirror 6 is formed on a predetermined area in a top surface of the four pairs p-GaAs/AlAs layers having the inverse circular truncated cone definition in which the predetermined area corresponds to the light emitting area or the carrier injection area of the active layer 4 the top cladding layer 5 in a plane view. The top distributed Bragg reflector mirror 6 has a mesa structure 10 which comprises a bottom trapezoid-shaped section including five pairs of the alternating laminations of the p-GaAs/AlAs layers and a top rectangular-shaped section including seven pairs of the alternating laminations of the p-GaAs/AlAs layers. The p-GaAs layers and p-AlAs layers have a relatively large difference in those refractive indexes due to a large compositional discontinuity to serve as the distributed Bragg reflective mirror. The p-GaAs layers and p-AlAs layers with the large difference in the refractive index have also a relatively large energy band gap discontinuity due to the large compositional discontinuity.

As modifications of the second embodiment, the above number of the periods for the n-type bottom and the p-type top distributed Bragg reflector mirrors may be changeable to much various conditions.

A p-electrode 14 is formed to cover not only the mesa structure 10 of the top distributed Bragg reflector mirror 6 and its adjacent portions. The p-electrode 14 is provided to cover at least the exposed top surface of the four pairs of the p-GaAs/AlAs layers 6 in which the exposed surface is not covered by the mesa structure of the top distributed Bragg reflector mirror 6. The p-electrode 14 is provided further to cover an edge portion of the top surface of the high resistive region 12. An n-electrode 13 is selectively provided at a peripheral position on a bottom surface of the n-GaAs substrate 1 so that the n-electrode 13 does not cover any light or laser beam emitting area. Alternatively, n-electrode 13 may be designed to have a window through which the light or laser beam is able to be transmitted.

The description of the second embodiment and some modifications thereof will subsequently be directed to fabrication processes for the above novel vertical-to-surface transmission electro-photonic device.

Figure 10A:
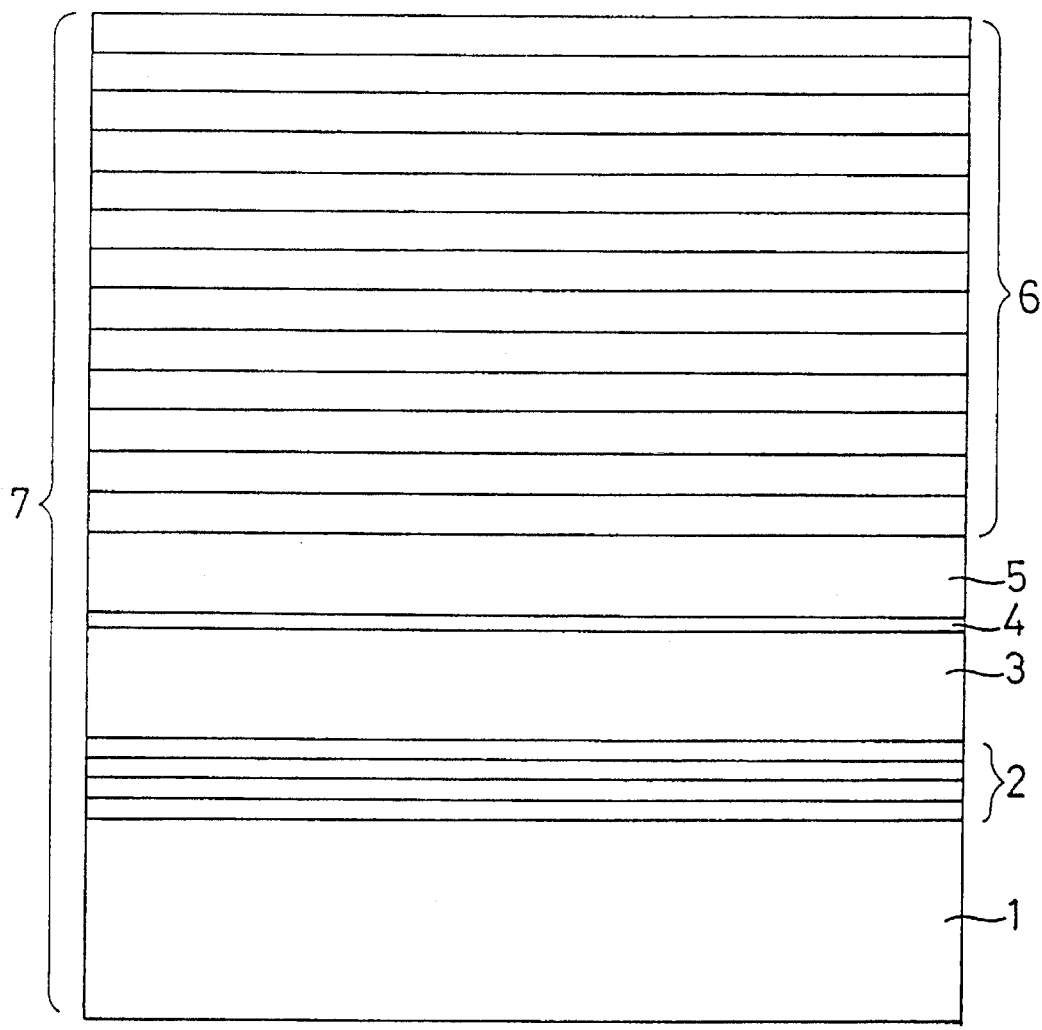
FIGS. 10A to 10 H are fragmentary cross sectional elevation views illustrative of sequential steps involved in a novel method for fabricating a novel vertical-to-surface transmission electro-photonic device of a second embodiment according to the present invention.

With reference to FIG. 10A, the n-GaAs substrate 1 is prepared and the n-GaAs layers and the n-AlAs layers are epitaxially and alternately grown by molecular beam epitaxy on the top surface of the n-GaAs substrate 1 until the four periods of the alternating laminations of the n-GaAs layers and the n-AlAs layers are formed to serve as the bottom distributed Bragg reflector mirror 2. The n-$Al_{0.3}Ga_{0.7}As$ epitaxial layer serving as the bottom cladding layer 3 is grown by molecular beam epitaxy on the top surface of the bottom distributed Bragg reflector mirror 2. The non-doped $In_{0.2}Ga_{0.8}As$ epitaxial layer serving as the active layer 4 is grown on the top surface of the bottom cladding layer 3 by molecular beam epitaxy. The p-$Al_{0.3}Ga_{0.7}As$ epitaxial layer serving as the top cladding layer 5 is grown on the top surface of the active layer 4 by molecular beam epitaxy. The p-GaAs layers and the p-AlAs layers are epitaxially and alternately grown by molecular beam epitaxy on the top surface of the top p-doped cladding layer 5 until the thirteen periods of the alternating laminations of the p-GaAs layers and the p-AlAs layers are 6 formed to serve as the p-doped top distributed Bragg reflector mirror thereby a vertical-to-surface transmission electro-photonic device substrate 7 is completed.

Figure 10B:
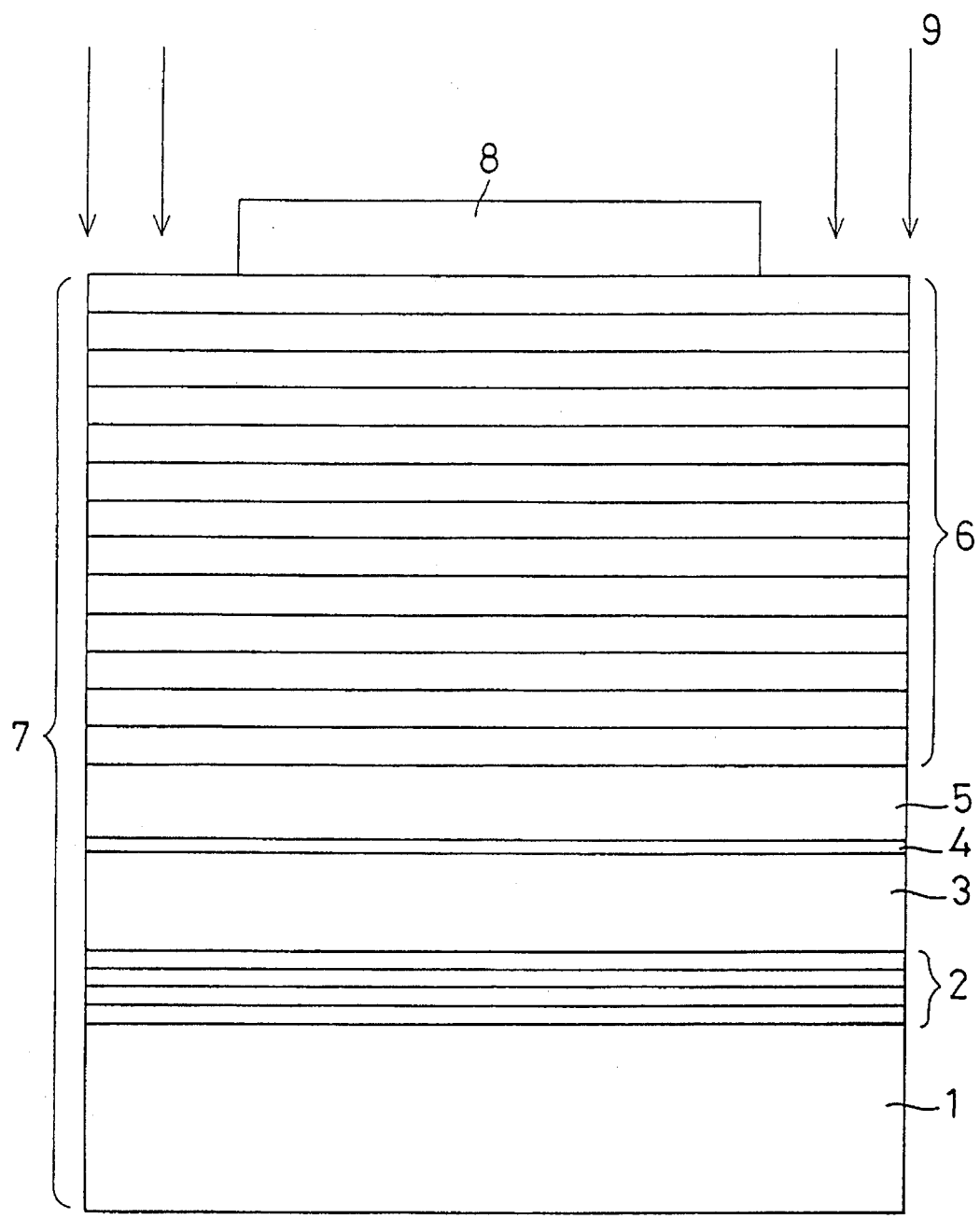
Figure 10C:
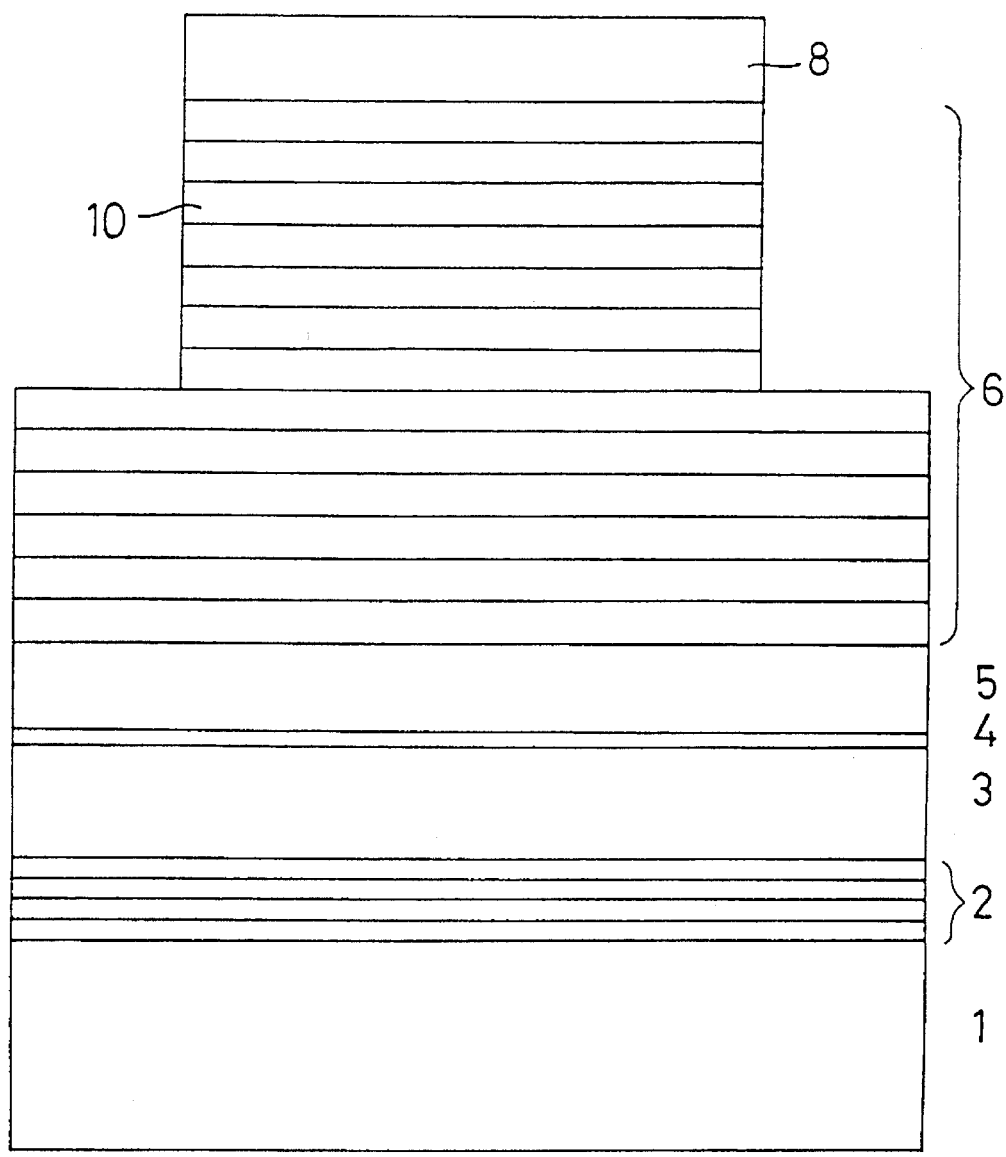

With reference to FIGS. 10B and 10C, a photo-resist film is formed on a top surface of the p-doped top distributed Bragg reflector 6 in the vertical-to-surface emitting laser substrate 7. The photo-resist film is subjected to patterning to form a photo-resist pattern within a predetermined area to be used for ion-beam etching. The photo-resist pattern 8 has a horizontal size of 10 micrometers square. Except for the bottom one or two periods of the p-GaAs layers and the p-AlAs layers 6, the alternating laminations of the p-GaAs/AlAs multiple layers 6 to act as the p-doped top distributed Bragg reflector mirror is selectively removed by a reactive ion-etching 9 using a chlorine gas and the photo-resist pattern 8 in a vertical downward direction until the bottom sixth pair of the p-GaAs/AlAs layers 6 is exposed so that the mesa structure 10 of the p-doped top distributed Bragg reflector 6 is defined under the photo-resist pattern 8. As illustrated in FIG. 10C, the mesa structure comprises a single rectangular-shaped section.

Figure 10D:
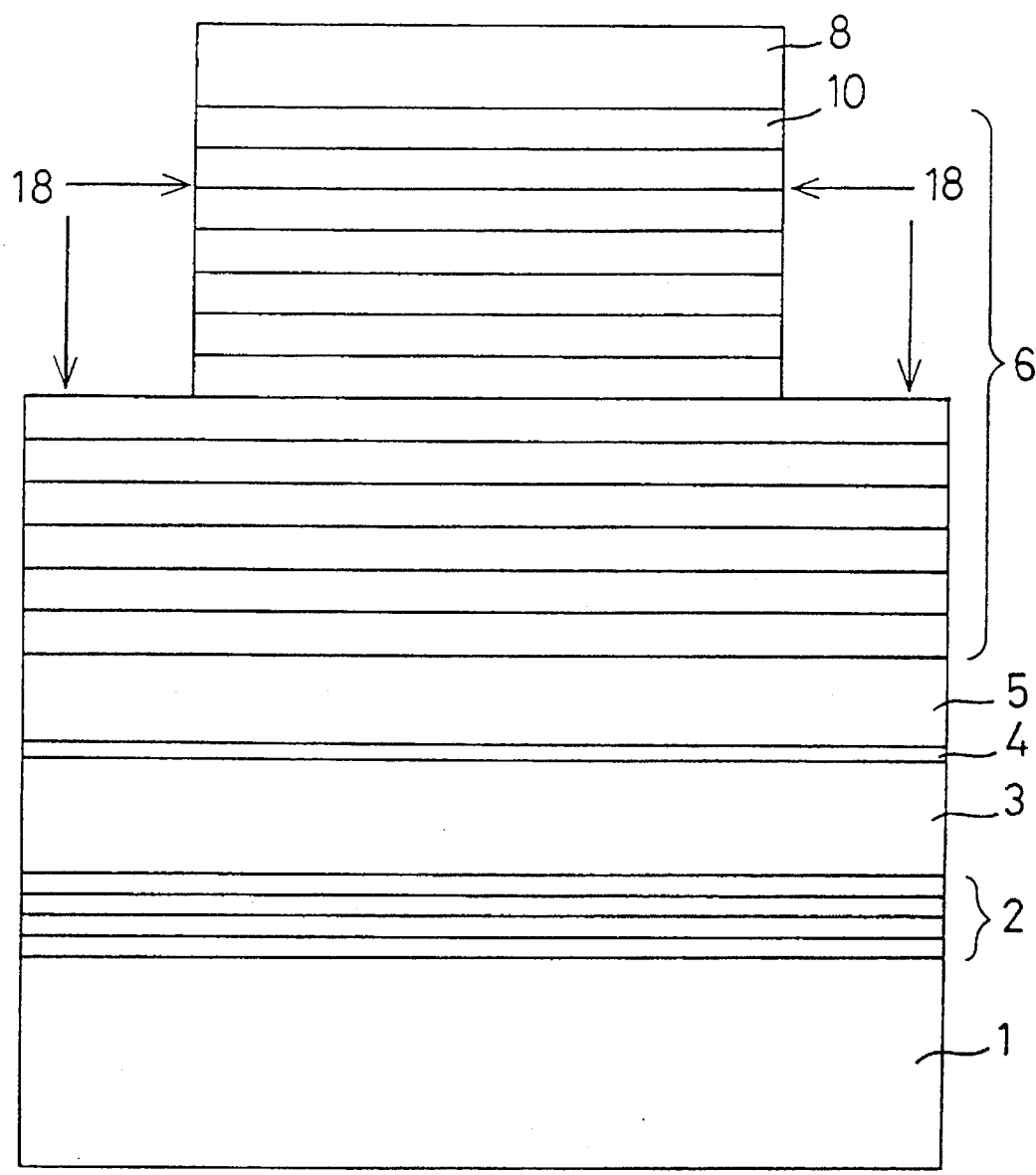

With reference to FIG. 10D, after the reactive ion-etching to form the mesa structure 10 of the top distributed Bragg reflector mirror 6, the photo-resist pattern 8 is not removed. The remaining p-GaAs/AlAs multiple layers 6 is further subjected to a wet etching 18 with use of a phosphoric acid system etchant so that the remaining p-GaAs/AlAs multiple layers 6 is isotopic etched until the bottom first pair of the p-GaAs/AlAs layers 6 remains.

Figure 10E:
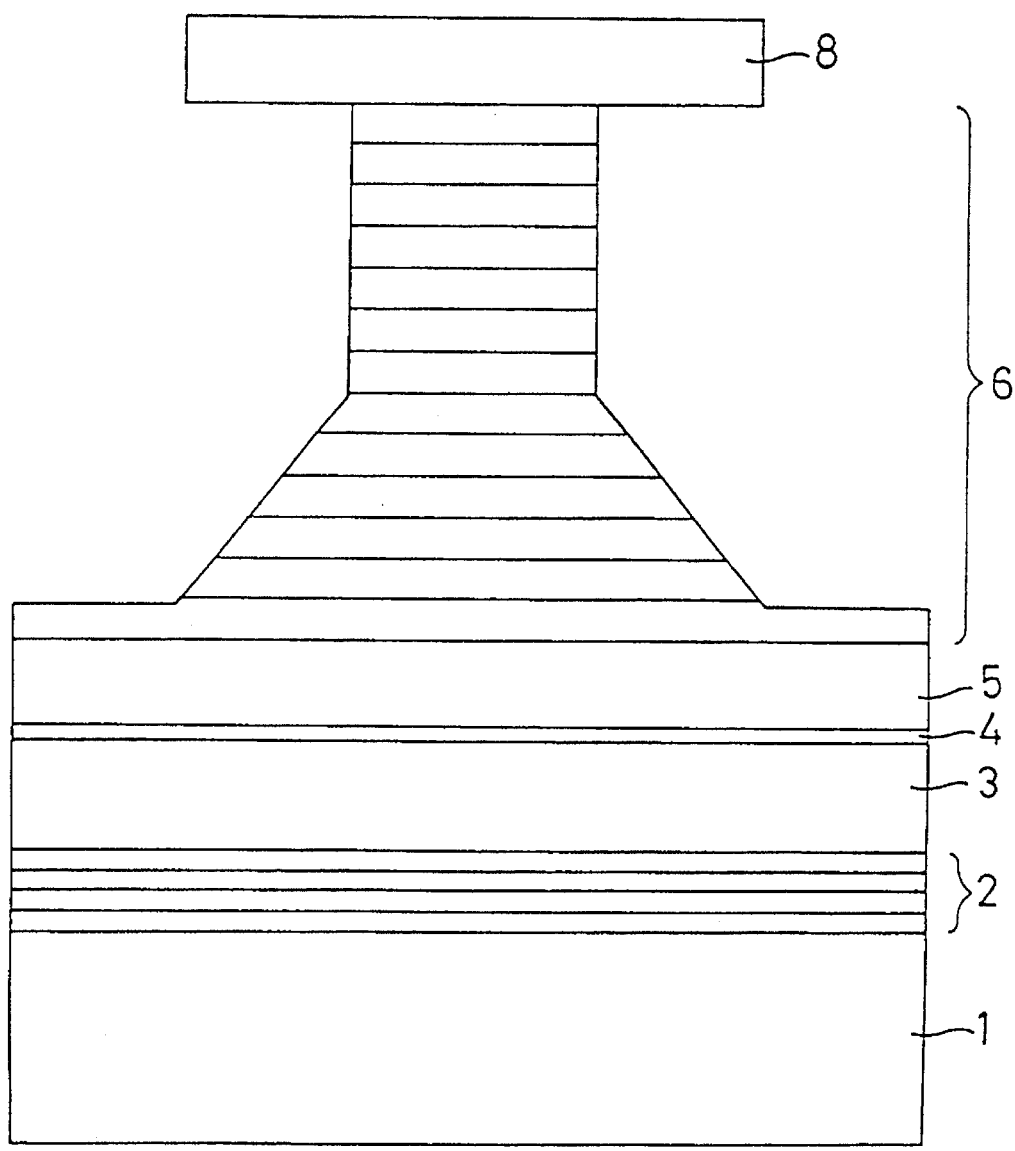

As illustrated in FIG. 10E, the wet etching defines the p-GaAs/AlAs multiple layers 6 into the definition which comprises the bottom trapezoid-shaped portion including the five pairs of the p-GaAs/AlAs layers 6 and the top rectangular-shaped portion including the seven pairs of the p-GaAs/AlAs layers 6. The photo-resist pattern 8 is expanded in the horizontal direction from the mesa structure 10 at each side. The photo-resist pattern 8 has at least a larger horizontal size than a horizontal size of the rectangular-shaped portion of the mesa structure 10.

Figure 10F:
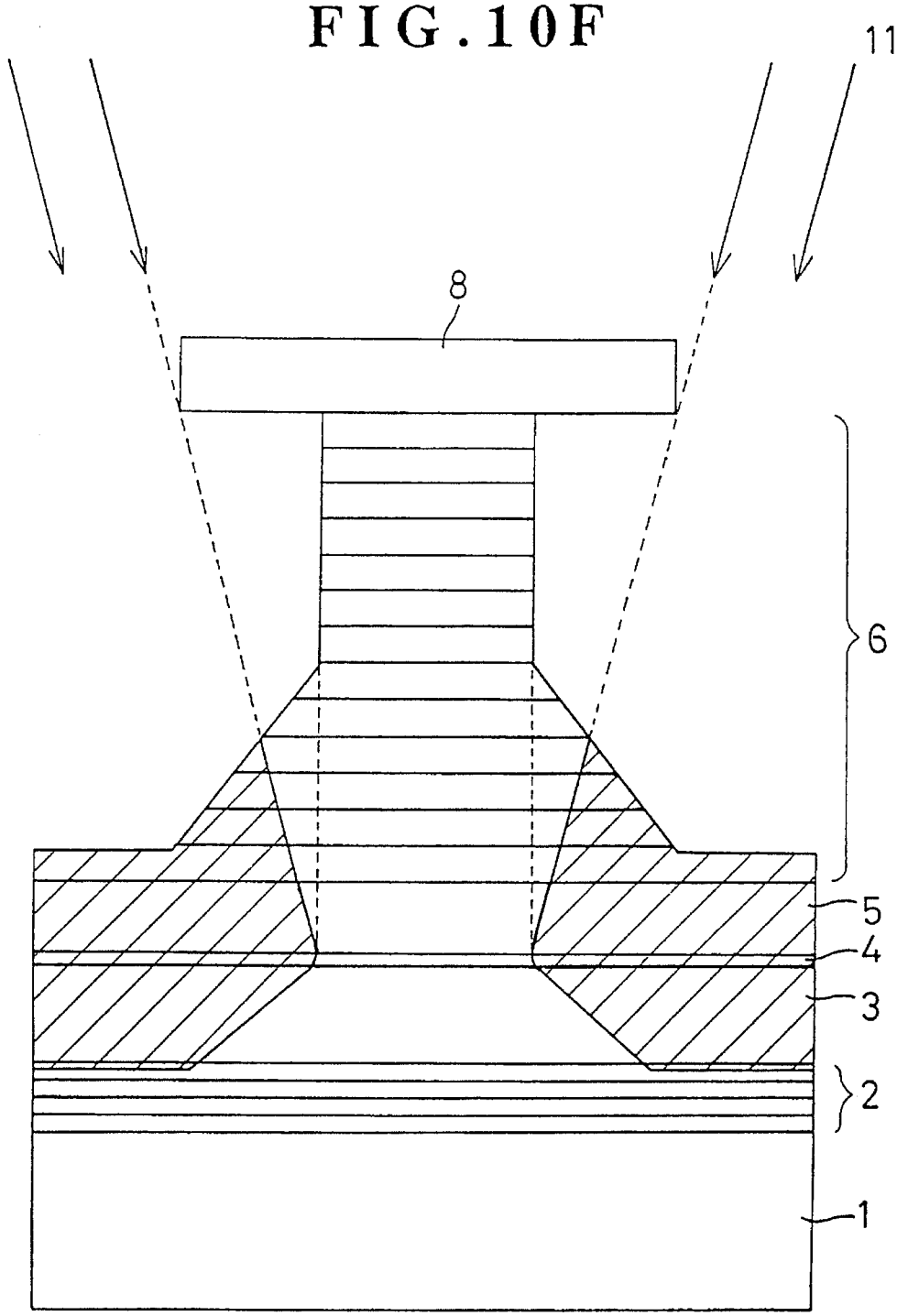

With reference to FIG. 10F, an ion-implantation 11 of proton in an oblique direction is accomplished by use of the photo-resist pattern 8 during a rotation of the substrate 1 to form a high resistive region of a proton implanted region. The high resistive region 12 comprising the proton implanted region has a desired proton concentration profile along a vertical direction having a peak at the depth at which the active layer 4 exists. The oblique direction ion-implantation forms the high resistive region 12 of the proton implanted region which defines the light emitting area or the carrier injection area of the active layer 4 in which the carrier injection area corresponds to an area in which the mesa structure 10 is formed in the plane view. The oblique direction ion-implantation also forms the high resistive region 12 of the proton implanted region which defines the united inverse circular truncated cone definition of the p-type top cladding region and the bottom four pairs of the p-GaAs/AlAs layers. The oblique direction ion-implantation also forms the high resistive region 12 of the proton implanted region which defines the circular truncated cone definition of the n-type bottom cladding region.

Cotrary to the vertical downward ion-implantation for formation of the high resistive proton implanted region in the above prior arts, in this oblique angle ion-implantation, proton is implanted into the high resistive region 12 neither throght any part of the p-type top cladding region having the inverse circular truncated cone definition nor through any parts of the p-GaAs/AlAs layers having the united inverse circular truncated cone definition, which could readily be understood from FIG. 10F. Needless to say, after the proton implantation, none of proton exists not only in the inverse circular truncated cone definition of the p-type top cladding region and the p-GaAs/AlAs layers but also in the light emitting area or the carrier injection area as well as in the circular truncated cone definition of the n-type bottom cladding region. The inverse circular truncated cone and circular truncated cone definitions of the p-type top cladding region and the p-GaAs/AlAs layers and the n-type bottom cladding region are completely free from any exposure of the ion-implantation of proton and thus the above regions are able to have extremely low electrical resistivities. The carriers or electrons and holes are able to flow through the inverse and non-inverse circular truncated cone definition regions of the p-type top and n-type bottom cladding regions without any experience of a potential barrier.

Whereas in the above descriptions the above n-type bottom and p-type top cladding regions 3 and 5 have the circular truncated cone and the inverse circular truncated cone definitions, modifications of the definitions thereof are acceptable. For example, the external definitions of the n-type bottom and the p-type top cladding regions may be a truncated pyramid and an inverse truncated pyramid respectively, for example, a quadrilateral truncated pyramid and an inverse quadrilateral truncated pyramid. In this case, the oblique directional ion-implantation of proton is accomplished by use of the photo-resist pattern 8 during a stationary state of the device. The oblique directional ion-implantation of proton is discontinued during a rotation of the substrate 1 by a predetermined angle. The above two steps are repeated in required times. The high resistive region 12 comprising the proton implanted region has a desired proton concentration profile along a vertical direction having a peak at the depth at which the active layer 4 exists. The oblique direction ion-implantation forms the high resistive region 12 of the proton implanted region which defines the light emitting area or the carrier injection area of the active layer 4 in which the carrier injection area corresponds to an area in which the mesa structure 10 is formed in the plane view. The oblique direction ion-implantation also forms the high resistive region 12 of the proton implanted region which defines the united inverse truncated pyramid definition of the p-type top cladding region and the bottom four pairs of the p-GaAs/AlAs layers. The oblique direction ion-implantation also forms the high resistive region 12 of the proton implanted region which defines the truncated pyramid definition of the n-type bottom cladding region.

The description will be back to the fabrication process for the device from the modifications thereof.

Figure 10G:
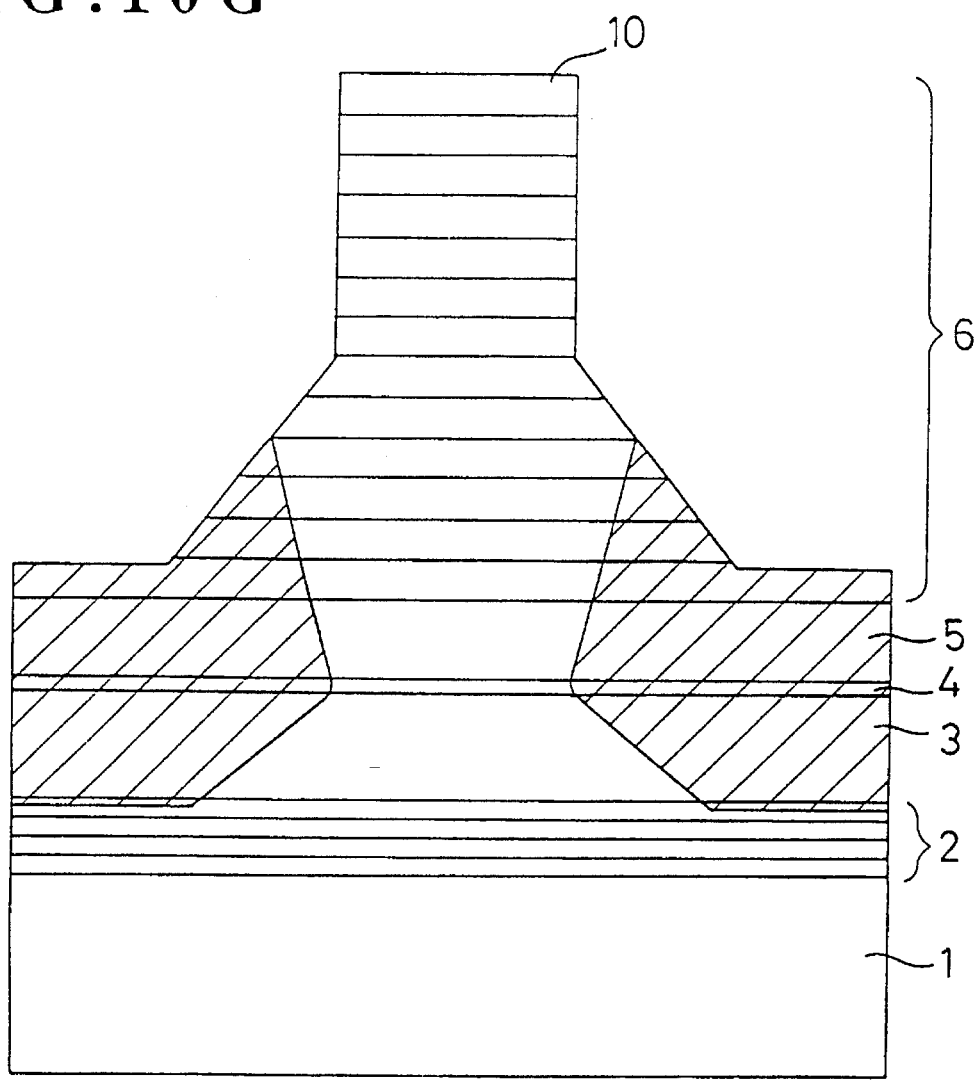
Figure 10:
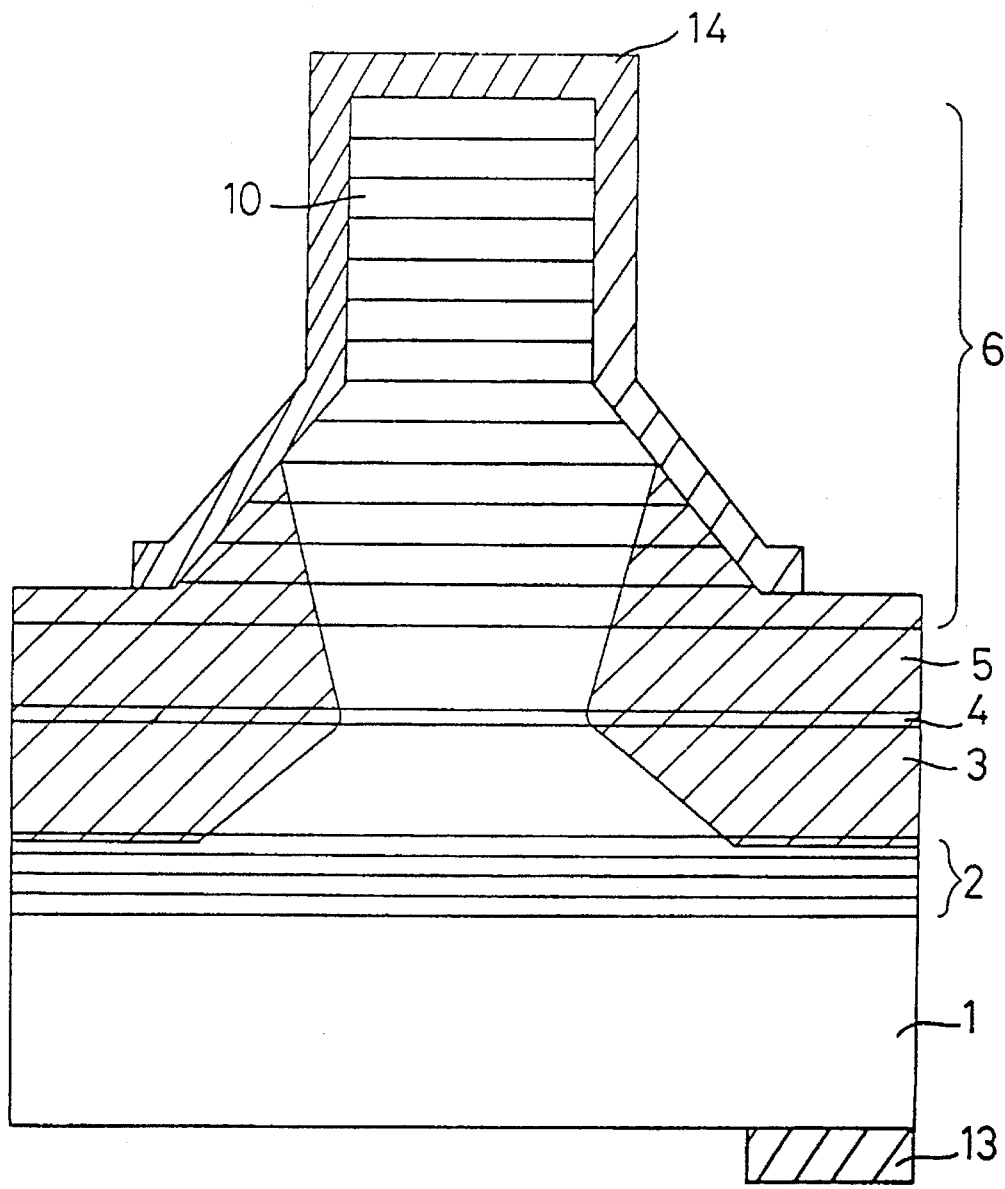
Figure 11:
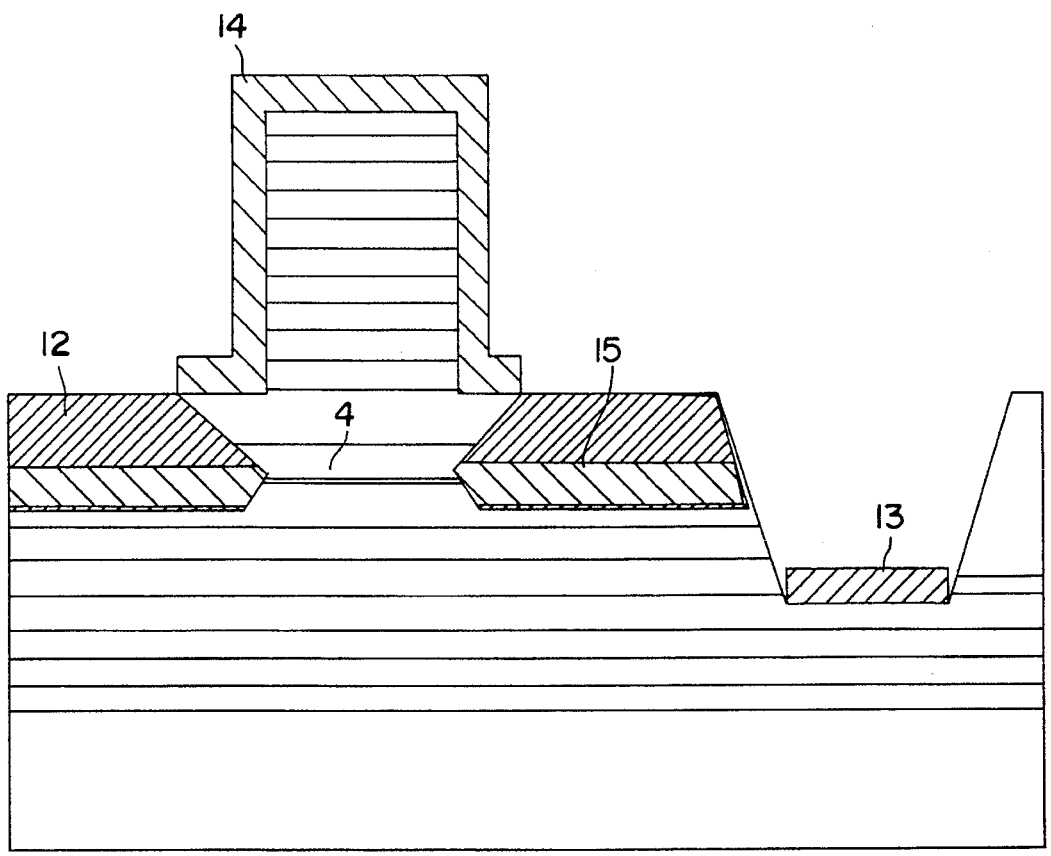
FIG. 11 is another fragmentary cross sectional elevation view of a structure of a novel vertical-to-surface transmission electro-photonic device showing the highly sensitive region 12 and the region 15 in which the implanted impurities came to rest.

With reference to FIGS. 10G and 10H, the photo-resist pattern 8 is removed. An n-electrode 13 is selectively provided at a peripheral position on a bottom surface of the n-GaAs substrate 1 so that the n-electrode 13 does not cover any light or laser beam emitting area. Alternatively, n-electrode 13 may be designed to have a window through which the light or laser beam is able to be transmitted. A p-electrode 14 is formed to cover the mesa structure 10 of the top distributed Bragg reflector mirror 6. The p-electrode 14 is provided to cover at least the exposed top surface of the four pairs of the p-GaAs/AlAs layers 6 in which the exposed surface is not covered by the mesa structure of the top distributed Bragg reflector mirror 6. The p-electrode 14 may selectively be provided further to cover an edge portion of the top surface of the high resistive region 12.

The negative carriers or electrons may be able to be injected from the n-electrode 13 into the active layer 4 in the carrier injection area through the circular truncated cone definition region of the n-type bottom cladding region in which the electrons have experienced no potential barrier. Further, the positive carrier or holes may also be able to be injected from the p-electrode 14 on the trapezoid-shaped portion of the mesa structure 10 into the active layer 4 in the carrier injection area through the inverse circular truncated cone definition region of the p-type bottom cladding region and the four pairs of the p-GaAs/AlAs layers in which the holes have experienced a slight potential barrier. It is much more important for reduction of the device electrical resistance that the holes have experienced no potential barrier during flowing through the inverse circular truncated cone definition region of the p-type top cladding region since holes have a much large effective mass than an effective mass of electrons.

The novel vertical-to-surface transmission electro-photonic device of the second embodiment according to the present invention, therefore, has the following advantages. The fabrication steps of the second embodiment are more simple than the fabrication process of the first embodiment.

A large part of the injection carriers or holes flows from the p-electrode 14 on the trapezoid-shaped portion of the mesa structure 10 through the ion-free inverse circular truncated cone definition region toward the light emitting area in the active layer 4 and receives the carrier confinement by the high resistive regions 12 of the proton implanted regions. Namely, a large part of the injection carriers flows not through the mesa structure 10.

From the above, it could readily be appreciated that the above ion-free inverse circular truncated cone definition region defined by the oblique angle ion-implantation is able to permit a remarkable reduction of the electrical resistance of the vertical-to-surface transmission electro-photonic device. The above desired definition of the high resistive region 12 is also able to permit the lateral carrier confinement which provides the high density carrier injection into the active layer 4. The high density carrier injection provides a strong laser beam emission from the active layer 4 in the vertical direction to the surface thereof. This leads to a remarkable improvement in the electronic-optical conversion efficiency of the vertical-to-surface transmission electro-photonic device. The novel vertical-to-surface transmission electro-photonic device further is able to show remarkably improved excellent properties in an external differential quantum efficiency and a threshold current due to that the device having an extremely low electrical resistance is free from any problems caused by a heat.

Whereas modifications of the present inventions will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications of the present invention which fall within the spirit and scope of the invention.

What is claimed is:

1. A vertical-to-surface transmission electro-photonic semiconductor device comprising:

a semiconductor substrate;

a bottom light reflective mirror formed on said semiconductor substrate for reflecting a light propagating in a vertical direction;

an intermediate multilayer structure formed on said bottom light reflective mirror, said intermediate multilayer structure including top and bottom epitaxial cladding layers sandwiching a quantum well active layer which shows a photoluminescence when carriers are injected into said active region, said top and bottom epitaxial cladding layers and said active layer being surrounded by both an impurity implanted region within which an impurity is implanted and a semiconductor crystal-damaged region overlying said impurity implanted region and said semiconductor crystal-damaged region having a high resistivity increased by crystal damages due to the fact that the impurity has passed therethrough for the purpose of an implantation of impurities into said impurity implanted region;

a top light reflective mirror of a mesa structure formed on said intermediate multilayer structure for reflecting a light propagating in a vertical direction; and an electrode comprising a first part provided on said mesa structure and a second part provided on a peripheral region of said mesa structure;

wherein said semiconductor crystal-damaged region and said impurity implanted region are formed by an impurity implantation at a predetermined oblique angle so that, just under said second part of said electrode, a region free of any crystal damage in said epitaxial cladding layer is positioned and further said semiconductor crystal-damaged region and said impurity implanted region have a linearly sloped boundary extending at said oblique angle from a first position at edges of said second part of said electrode to a second position having the same level to said active layer and positioned just under vertical side walls of said semiconductor mesa structure to restrict a usable area of said active layer within the same area as said mesa structure to thereby allow that the majority of said carriers flows from said second part of said electrode through said crystal damage free region into said usable part of said active layer without passing through any part of said semiconductor crystal-damaged region.

2. The device as claimed in claim 1, wherein said oblique angle is approximately 14 degrees.

3. The device as claimed in claim 1, wherein said impurity implantation in the oblique direction is carried out by use of a mask provided on said mesa structure and having a horizontal size larger than a size of said mesa structure wherein said impurity is implanted in said oblique direction.

4. The device as claimed in claim 3, wherein said oblique direction and said horizontal size of said mask are determined to satisfy with the following conditions:

$$B=(2D(W_1+W_2)/W_2)+A; \text{ and}$$

$$\beta+\tan^{-1}(W_2 \div D)$$

wherein B is the horizontal size of said mask, $\beta$ is the oblique angle of said oblique direction to said interfere of said active region, $W_1$ is the vertical distance between a bottom of said mask and a top of said top epitaxial cladding layer, $W_2$ is the vertical distance between the first and second positions, A is the horizontal size of said active layer and D is the horizontal distance between said first and second positions.

5. The device as claimed in claim 3, wherein said impurity implantation is carried out together with a rotation of said substrate around a center axis of said mesa structure.

6. The device as claimed in claim 1, wherein said mesa structure is defined by side walls right-vertical to a surface of said substrate.

7. The device as claimed in claim 1, wherein said mesa structure comprises:
   a first section being wide-based to have various horizontal areas linearly increased in a direction from top to bottom; and
   a second section formed on said first section and defined by side walls right-vertical to a surface of said substrate.

8. The device as claimed in claim 1, wherein:
   said active layer includes a non-doped $In_{0.2}Ga_{0.8}As$ quantum well layer; and
   said top and bottom epitaxial cladding layers comprise $Al_{0.3}Ga_{0.7}As$ layers.

9. The device as claimed in claim 1, wherein each of said top and bottom reflective mirrors comprises alternating laminations of impurity-doped GaAs layers and impurity-doped AlAs layers.

10. The device as claimed in claim 9, wherein said impurity-doped GaAs layers and impurity-doped AlAs layers have a thickness equal to a quarter of a medium wavelength of light.

* * * * *